(12) United States Patent
Griebenow et al.

(10) Patent No.: US 8,786,027 B2
(45) Date of Patent: Jul. 22, 2014

(54) TRANSISTORS COMPRISING HIGH-K METAL GATE ELECTRODE STRUCTURES AND EMBEDDED STRAIN-INDUCING SEMICONDUCTOR ALLOYS FORMED IN A LATE STAGE

(71) Applicant: GLOBALFOUNDRIES Inc., Grand Cayman (KY)

(72) Inventors: Uwe Griebenow, Markkleeberg (DE); Jan Hoentschel, Dresden (DE); Thilo Scheiper, Dresden (DE); Sven Beyer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/886,373

(22) Filed: May 3, 2013

(65) Prior Publication Data
US 2013/0240988 A1    Sep. 19, 2013

Related U.S. Application Data

(62) Division of application No. 13/117,249, filed on May 27, 2011, now Pat. No. 8,455,314.

(30) Foreign Application Priority Data

Jul. 30, 2010    (DE) .......................... 10 2010 038 737

(51) Int. Cl.
*H01L 29/76* (2006.01)
*H01L 29/34* (2006.01)
*H01L 31/062* (2012.01)
*H01L 31/119* (2006.01)

(52) U.S. Cl.
USPC .... 257/388; 257/508; 257/576; 257/E21.007; 257/E21.051; 257/E21.054; 257/E21.058; 257/E21.17; 257/E21.32; 257/E21.37; 257/E21.216; 257/E21.267; 257/E21.296; 257/E21.249; 257/E21.304

(58) Field of Classification Search
USPC ......... 257/388, 382, 384, 508, 576, 689, 757, 257/771, E21.007, E21.051, E21.054, 257/E21.058, E21.17, E21.32, E21.37, 257/E21.216, E21.267, E21.296, E21.304, 257/E21.249
See application file for complete search history.

(56) References Cited

U.S. PATENT DOCUMENTS

| 6,943,087 B1 | 9/2005 | Xiang et al. ................... 438/311 |
| 7,741,167 B2 | 6/2010 | Beyer et al. ................... 438/199 |

(Continued)

FOREIGN PATENT DOCUMENTS

DE    102006051491 A1    5/2008    ............ H01L 27/092

OTHER PUBLICATIONS

Translation of Official Communication from German Patent Office for German Patent Application No. 10 2010 038 737.1-33 dated Mar. 24, 2011.

*Primary Examiner* — David Nhu
(74) *Attorney, Agent, or Firm* — Amerson Law Firm, PLLC

(57) ABSTRACT

In sophisticated semiconductor devices, replacement gate approaches may be applied in combination with a process strategy for implementing a strain-inducing semiconductor material, wherein superior proximity of the strain-inducing semiconductor material and/or superior robustness of the replacement gate approach may be achieved by forming the initial gate electrode structures with superior uniformity and providing at least one cavity for implementing the strained channel regions in a very advanced manufacturing stage, i.e., after completing the basic transistor configuration.

20 Claims, 14 Drawing Sheets

(56) References Cited

U.S. PATENT DOCUMENTS

| | | | |
|---|---|---|---|
| 8,241,977 B2 | 8/2012 | Scheiper et al. | 438/216 |
| 8,283,232 B2 | 10/2012 | Beyer et al. | 438/287 |
| 8,298,885 B2 * | 10/2012 | Wei et al. | 438/190 |
| 8,343,826 B2 * | 1/2013 | Kronholz et al. | 438/217 |
| 8,357,573 B2 * | 1/2013 | Kronholz et al. | 438/199 |
| 8,455,314 B2 * | 6/2013 | Griebenow et al. | 438/199 |
| 2005/0260801 A1 | 11/2005 | Divakaruni et al. | 438/151 |
| 2007/0155063 A1 | 7/2007 | Datta et al. | 438/142 |
| 2009/0302412 A1 | 12/2009 | Cheng et al. | 257/506 |

* cited by examiner

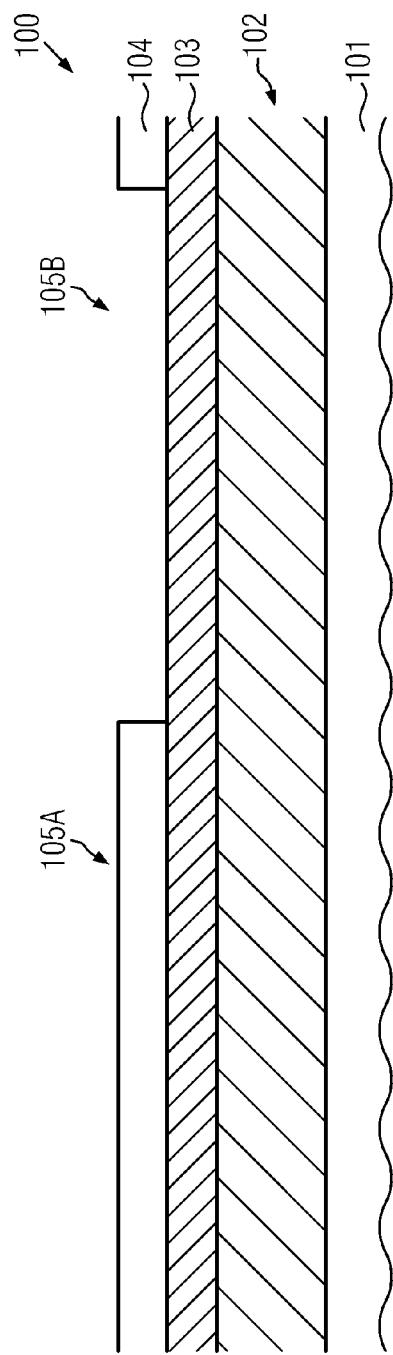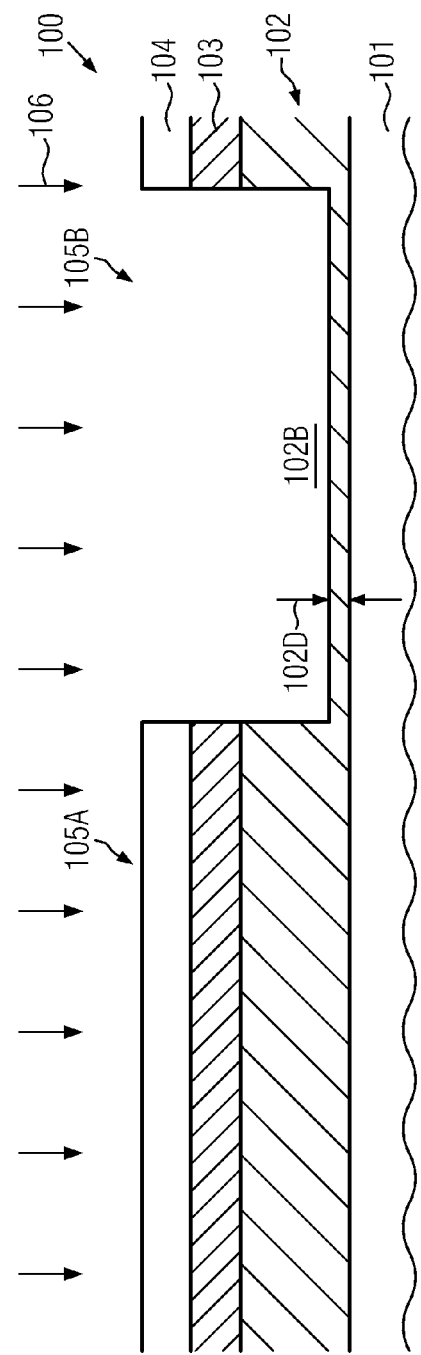

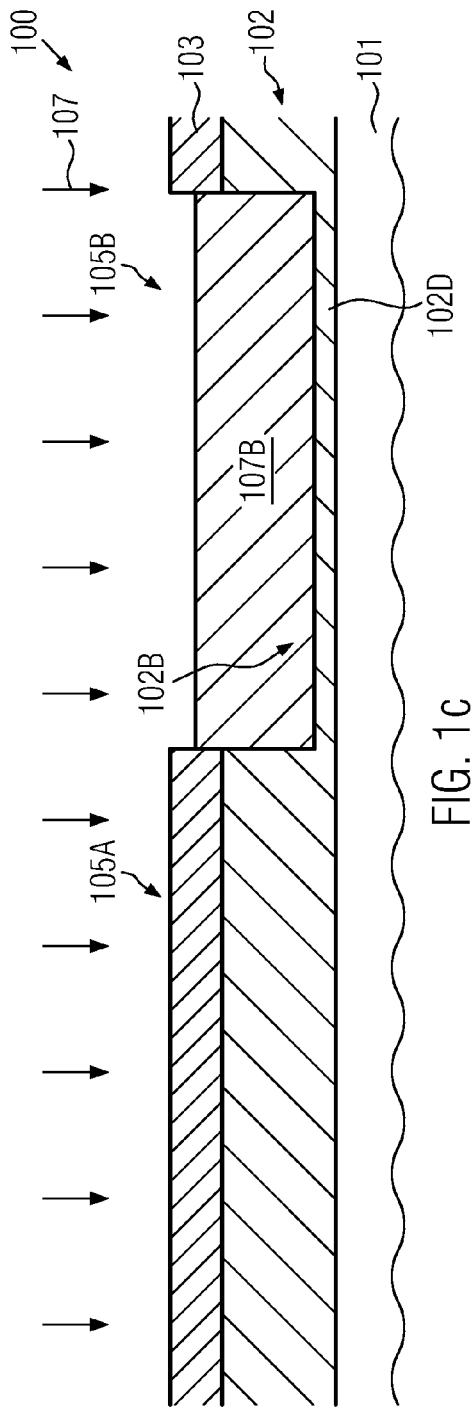
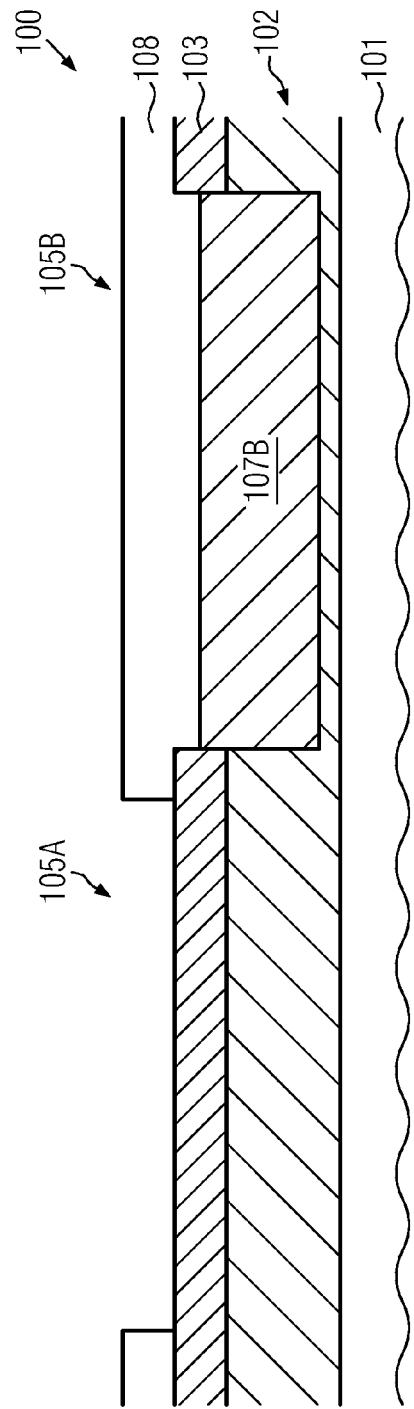
FIG. 1c
FIG. 1d

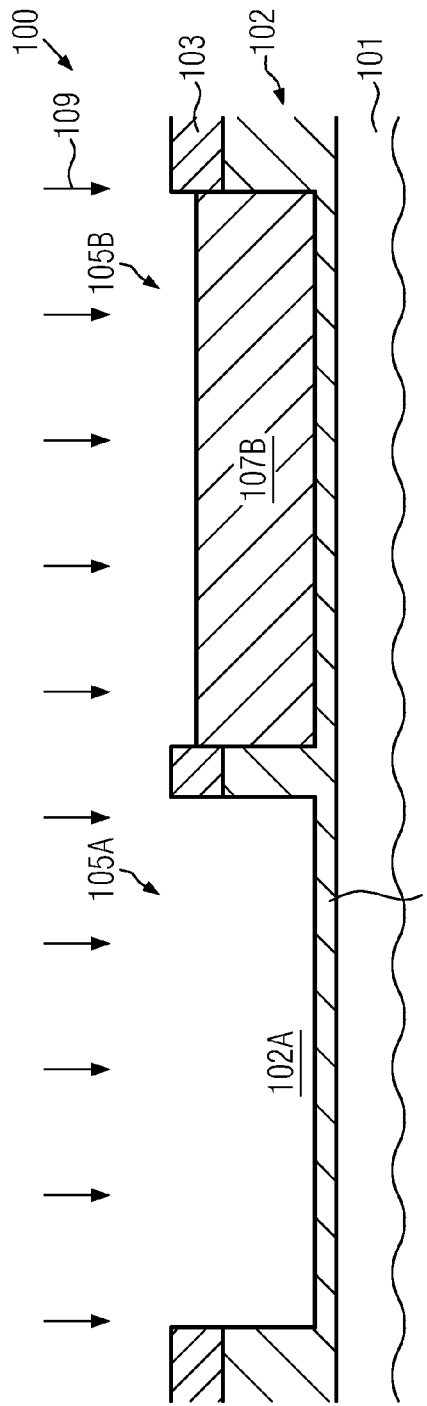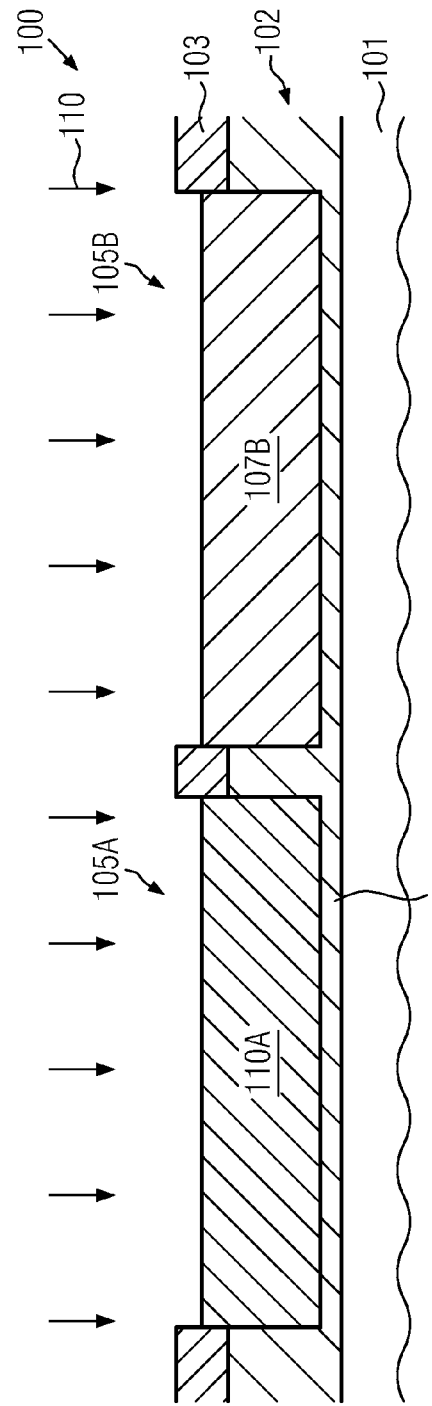

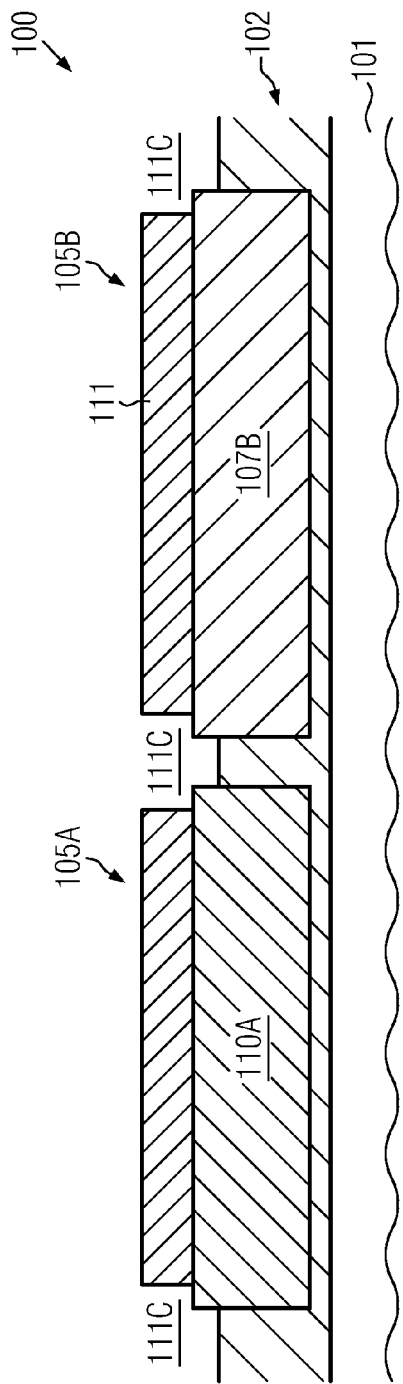
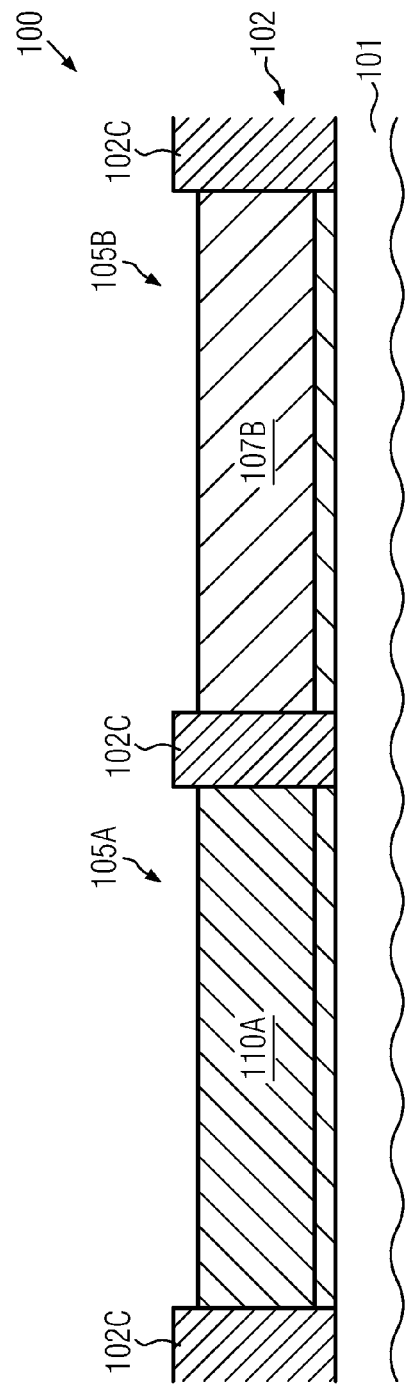

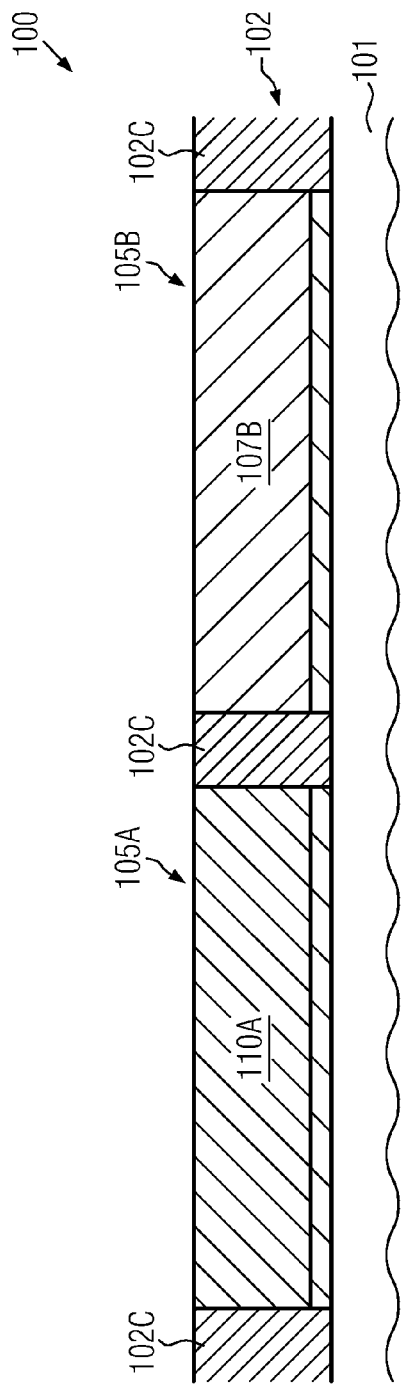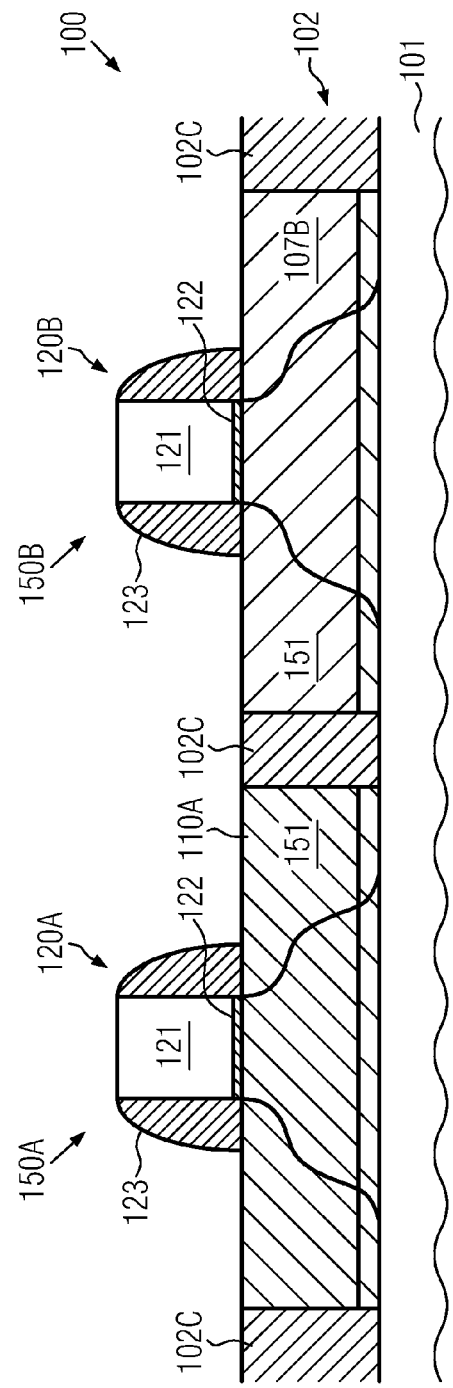

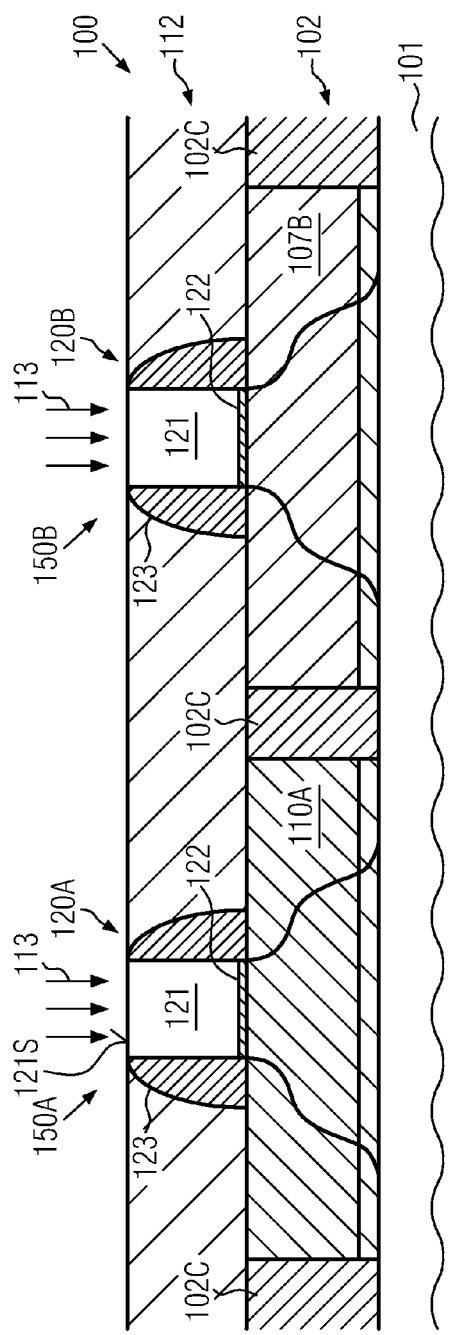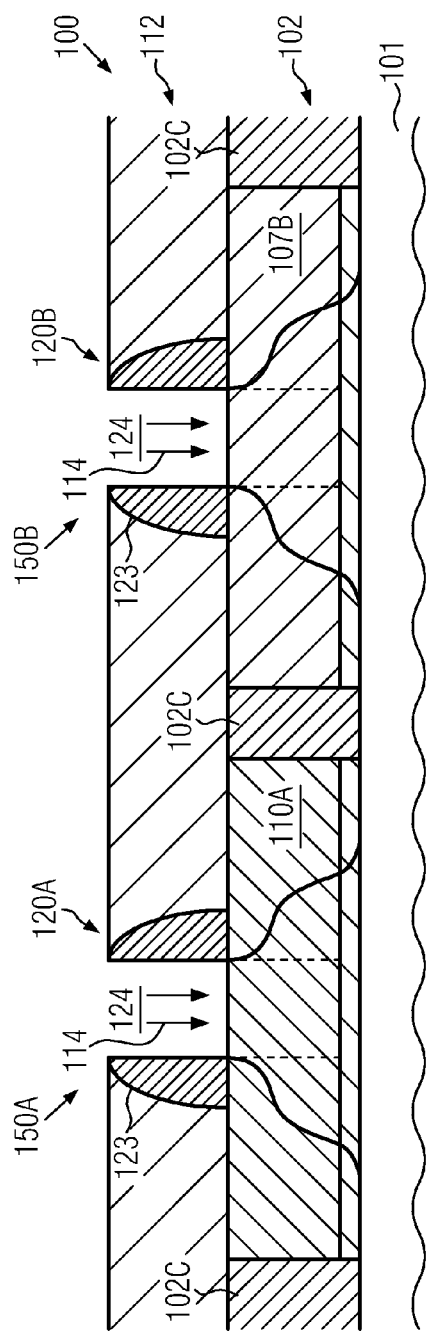

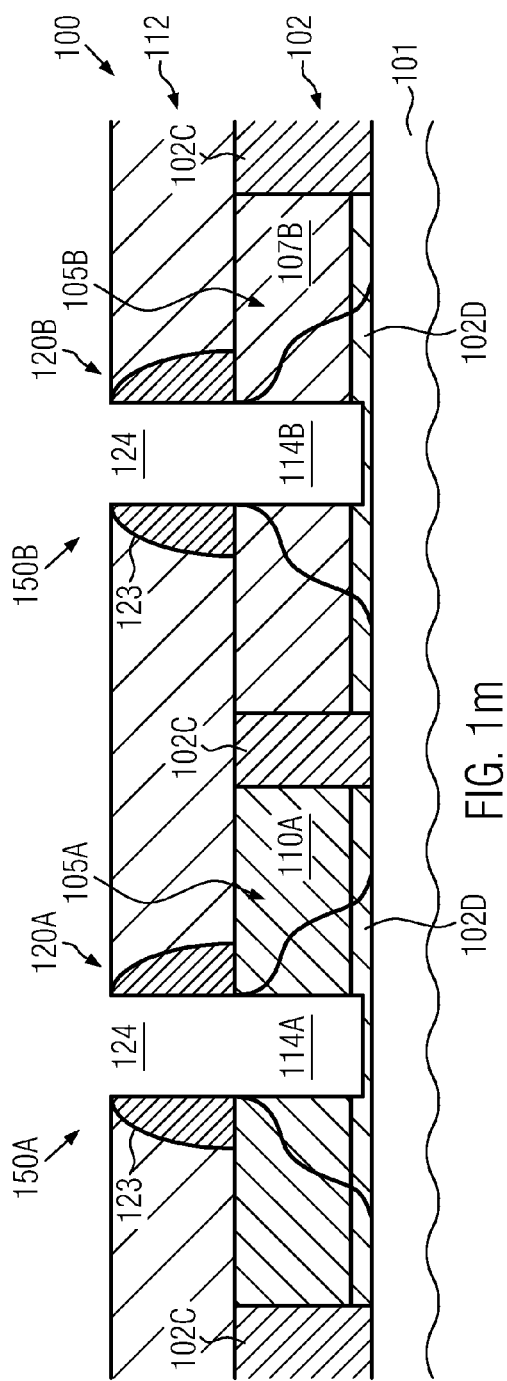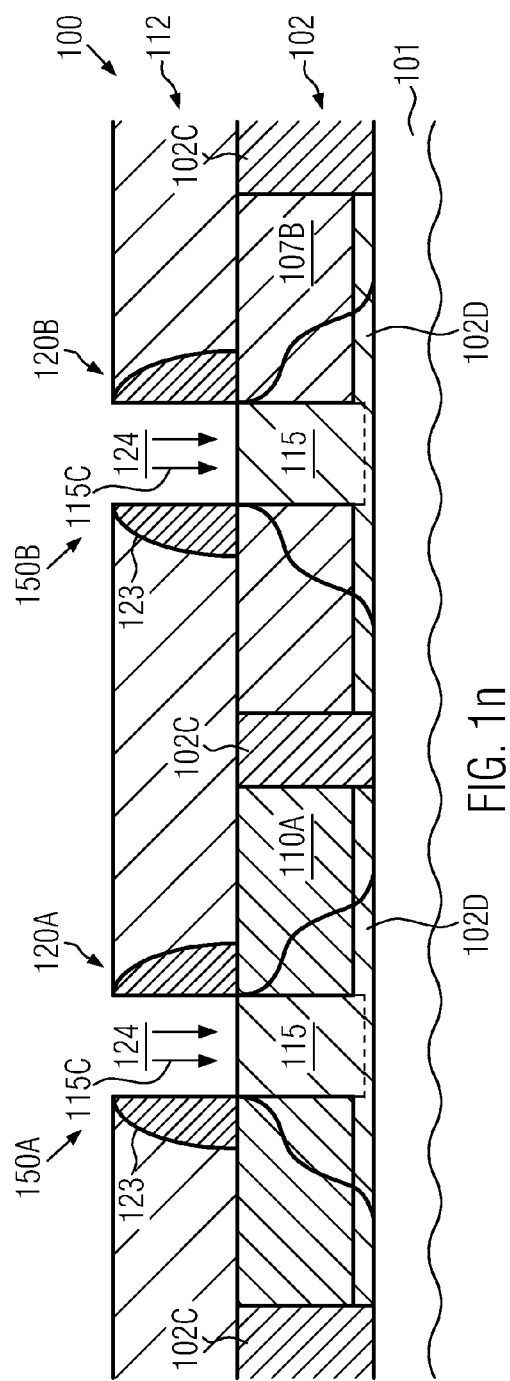

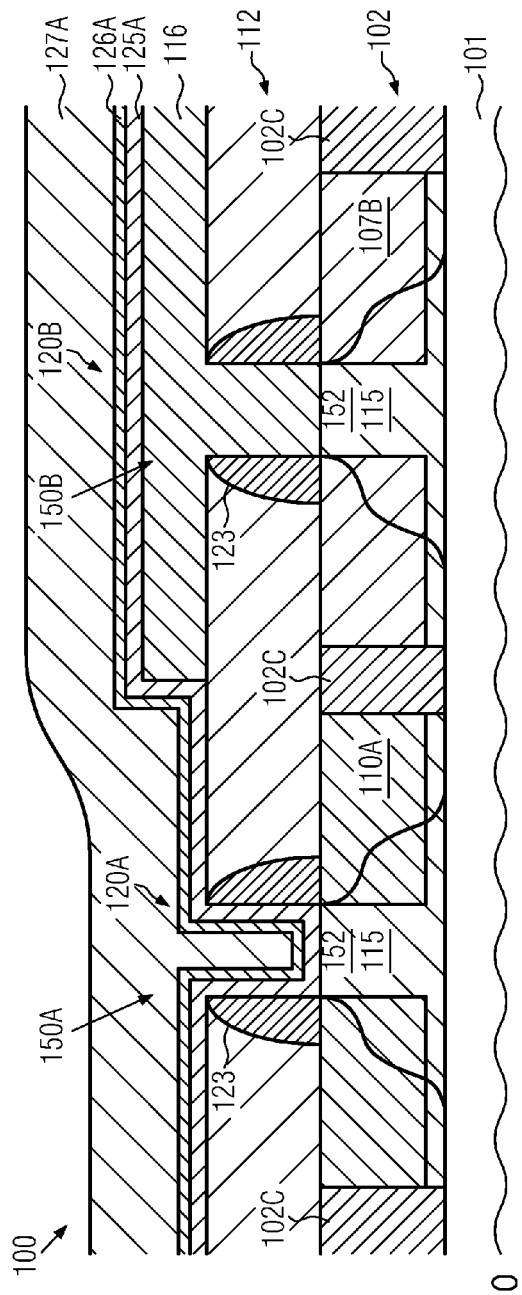
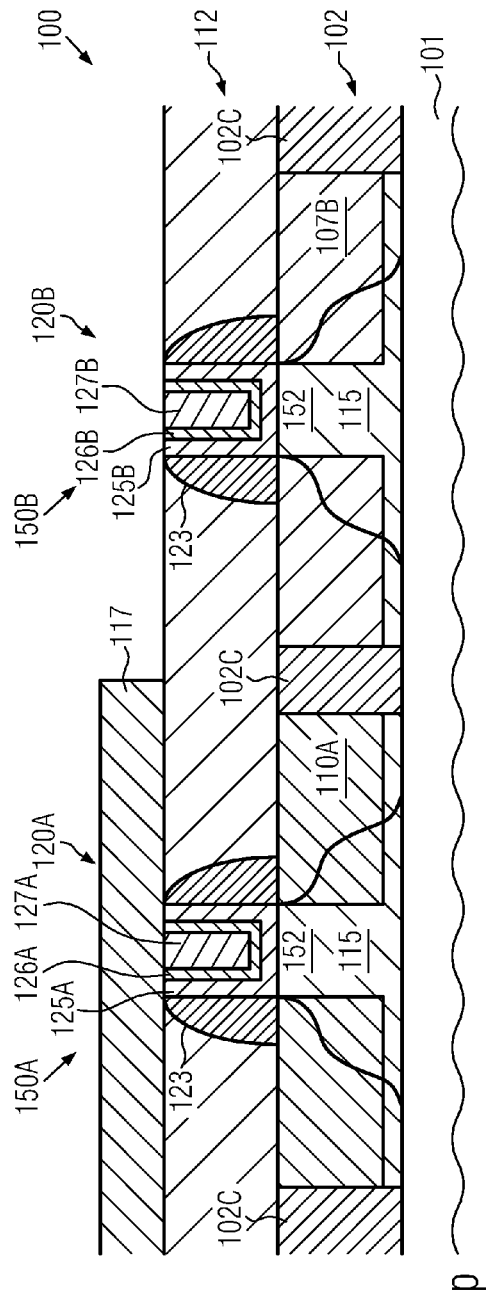
FIG. 1o
FIG. 1p

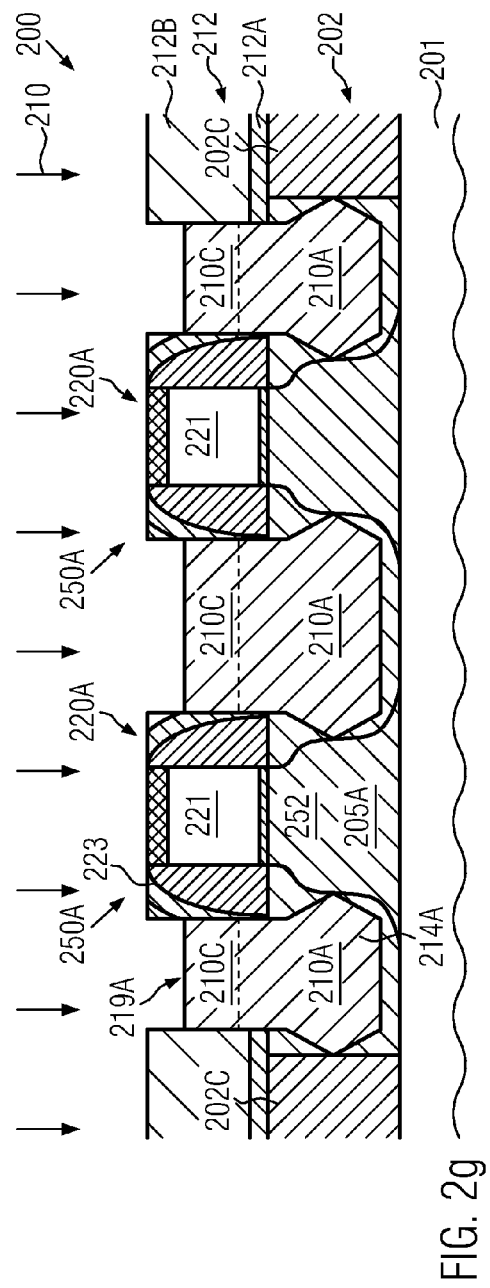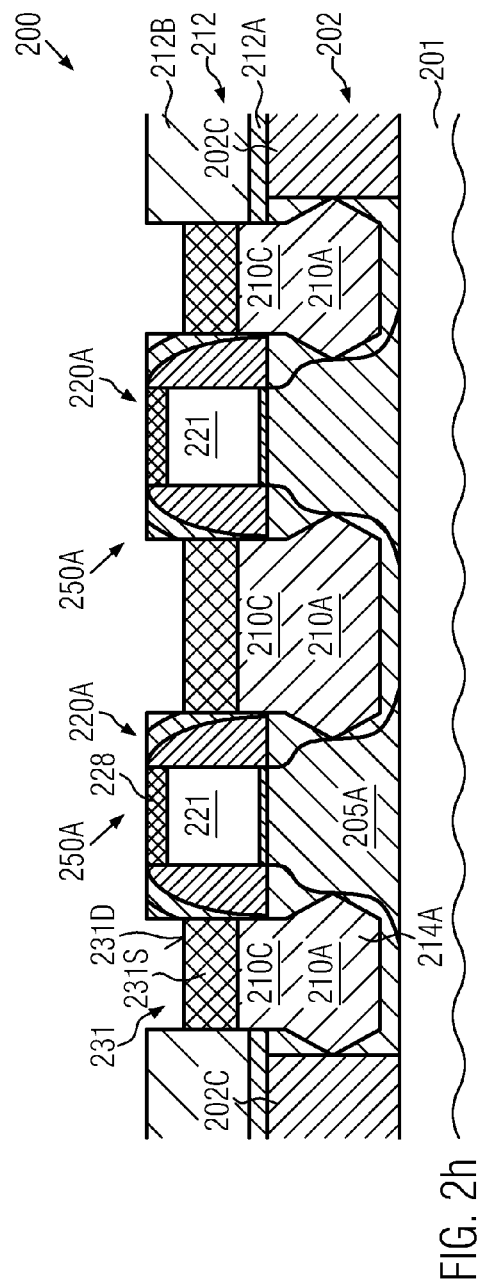

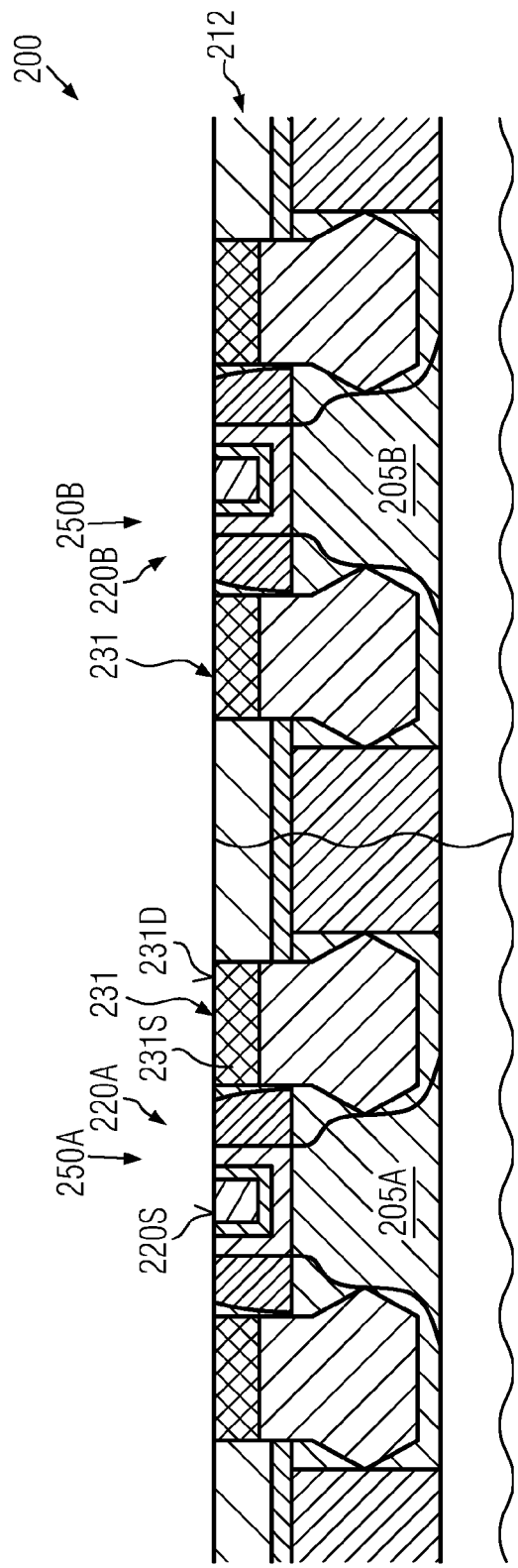

TRANSISTORS COMPRISING HIGH-K METAL GATE ELECTRODE STRUCTURES AND EMBEDDED STRAIN-INDUCING SEMICONDUCTOR ALLOYS FORMED IN A LATE STAGE

CROSS-REFERENCE TO RELATED APPLICATION

This is a divisional of co-pending application Ser. No. 13/117,249, filed May 27, 2011, which claims priority from German Patent Application No. 10 2010 038 737.1, filed Jul. 30, 2010.

BACKGROUND OF THE INVENTION

1. Field of the Invention

Generally, the present disclosure relates to the fabrication of sophisticated integrated circuits including transistor elements comprising high-k metal gate electrode structures.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions represented by an interface that is formed by highly doped regions, referred to as drain and source regions, and by a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the electronic characteristics of the channel regions, such as dopant concentration and band gap, the mobility of the charge carriers and, for a given extension of the channel region in the transistor width direction, on the distance between the source and drain regions, which is also referred to as channel length. Hence, the conductivity of the channel region substantially affects the performance of MOS transistors.

Presently, the vast majority of integrated circuits are based on silicon due to substantially unlimited availability, the well-understood characteristics of silicon and related materials and processes and the experience gathered during the last 50 years. Therefore, silicon will likely remain the base material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. It turns out that decreasing the channel length requires an increased capacitive coupling between the gate electrode and the channel region to avoid the so-called short channel behavior during transistor operation. Thus, the thickness of the silicon dioxide layer has to be correspondingly reduced to provide the required capacitance between the gate and the channel region. For example, a channel length of approximately 0.08 μm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may not be compatible with thermal design power requirements for many types of integrated circuits.

Therefore, replacing silicon dioxide based dielectrics, at least in part, as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would otherwise be obtained by an extremely thin silicon dioxide layer.

Additionally, transistor performance may be increased by providing an appropriate conductive material for the gate electrode so as to replace the usually used polysilicon material, at least in the vicinity of the gate dielectric material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone and providing superior conductivity compared to the doped polysilicon material. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration and the performance characteristics thereof has to be guaranteed when using metal-containing electrode materials.

Providing different metal species for adjusting the work function of the gate electrode structures for P-channel transistors and N-channel transistors at an earlier manufacturing stage may, however, be associated with a plurality of difficulties arising from the fact that a complex patterning sequence may be required during the formation of the sophisticated high-k metal gate stack. For this reason, significant variations of the resulting work functions and thus threshold voltages of the completed transistor structures may be generated. In other approaches, so-called replacement gate approaches, the gate electrode structures are provided with a high degree of compatibility with conventional patterning regimes, for instance based on polysilicon, and the high-k dielectric material and the metal-containing materials for adjusting the appropriate work functions and providing a high conductivity are incorporated in a very late manufacturing stage, i.e., after completing the basic transistor structure and thus after any high temperature processes, thereby avoiding many of the problems of process strategies in which the sensitive high-k materials in combination with the metal-containing electrode materials are provided in an early manufacturing stage.

In addition to providing sophisticated high-k metal gate electrode structures, other mechanisms are typically implemented in transistors in order to increase the overall performance, for instance, in terms of the electronic characteristics of the channel region. For example, it is well known that the charge carrier mobility in the channel region may be efficiently modified by inducing a strained state therein, which may be accomplished by various strain-inducing mechanisms, such as providing an embedded strained semiconductor material in the drain and source regions, thereby inducing a desired strain component in the channel region.

The approach of providing an embedded strain-inducing semiconductor material in the active regions of the transistors is typically implemented by forming cavities in the active regions adjacent to the gate electrode structures and providing a desired semiconductor alloy, such as silicon/germanium, silicon/carbon and the like, by using selective epitaxial growth techniques, wherein the material composition and the offset of the grown semiconductor alloy substantially determines the finally obtained strain component in the channel region of the transistor devices. Due to providing the strain-inducing semiconductor alloy in a relatively early manufacturing stage, i.e., after patterning the replacement gate electrode structure and prior to forming any drain and source regions of the transistors, the relatively complex process of forming the embedded strain-inducing semiconductor alloy and the complex process of providing sophisticated high-k metal gate electrode structures on the basis of a replacement gate approach may be considered as independent process modules, each of which may add a significant degree of complexity to the overall process flow and may provide certain advantages in overall performance of the transistors, as discussed above. Consequently, in conventional process strategies using embedded strain-inducing semiconductor materials in combination with sophisticated replacement gate approaches, many additional process steps may have to be applied, wherein a non-related application of these additional process steps, as is the case in conventional process strategies, may fail to fully exploit the potential of the performance enhancing effects of the above-described mechanisms, thereby resulting in less optimal transistor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which an embedded strain-inducing semiconductor material may be provided in sophisticated transistor elements on the basis of manufacturing strategies which may be correlated with manufacturing steps for providing a high-k metal gate electrode structure on the basis of a replacement gate approach. In this manner, pronounced synergy effects may be achieved when forming sophisticated transistor devices, thereby enhancing performance and/or production efficiency of complex semiconductor devices. To this end, the configuration of the semiconductor device, after completing the basic transistor configuration and prior to actually forming at least the metal-containing electrode material in the gate electrode structure, may be used for forming one or more cavities in the active region of the transistors in order to form a semiconductor material by selective epitaxial growth techniques, which may result in a superior strain component within a portion of the active region. For example, in some illustrative embodiments disclosed herein, the gate electrode structure may be provided on a strained semiconductor material of the active region and a portion of the strained material may be removed by means of a gate opening that is obtained upon removing a placeholder material, such as a polysilicon material. Consequently, the resulting cavity may be refilled, at least partially, by a desired semiconductor material, such as a silicon material, which may thus be regrown on the basis of a strained state due to the adjacent strain-inducing semiconductor material, thereby providing precise alignment of the newly-grown semiconductor material with respect to the gate electrode structure, while also a desired high strain may be achieved due to the close proximity of the strain-inducing material and the regrown semiconductor material. Furthermore, the regrown semiconductor material may have incorporated therein a desired dopant species or any other atomic species for further adjusting the electronic characteristics of a central portion of the active region. For example, additional well dopant species and channel dopant species may be incorporated without creating crystal damage, as may typically be associated with conventional process techniques, in which implantation processes may typically be applied. Furthermore, at any stage of the epitaxial growth process, a desired material composition of the regrown semiconductor material may be provided in order to obtain the desired electronic characteristics, for instance in terms of threshold voltage and the like. For example, a certain adjustment of energy level of a material layer that may immediately be in contact with a gate dielectric material may be adjusted on the basis of the selective epitaxial growth process in a final step thereof. Consequently, the strain-inducing semiconductor material may be provided at any appropriate manufacturing stage, for instance prior to forming any gate electrode structures, by using any appropriate process techniques, such as recessing the initial semiconductor layer at specific areas and refilling the recesses by any appropriate strain-inducing semiconductor material, such as silicon/germanium, silicon/carbon and the like. In other cases, stress memorization techniques may be applied locally in order to form areas of significant internal strain, while, in still other cases, even globally strained semiconductor layers may be used, if considered appropriate.

In other illustrative embodiments disclosed herein, cavities may be provided in the active regions of transistors on the basis of replacement gate approaches prior to actually implementing the metal-containing electrode material, wherein the cavities may be formed on the basis of contact openings formed in a dielectric material that laterally encloses the gate electrode structures. In the cavities and at least a portion of the contact openings, a desired semiconductor material may be provided on the basis of selective epitaxial growth techniques, which may provide a high strain component in the active region and, if desired, may provide superior contact characteristics in the contact openings, for instance by enabling an efficient silicidation process. Also in this case, any appropriate dopant species may be implemented during at least certain phases of selective epitaxial growth processes. Thereafter, the placeholder material, such as the polysilicon material, may be replaced by at least a metal-containing electrode material, wherein the presence of the contact elements may provide superior process conditions, for instance, with respect to exposing the polysilicon surface, enabling a dedicated adjustment of the final height of the replacement gate electrode structures and the like. Consequently, also in this case, superior performance and/or superior process efficiency may be accomplished by "combining" the implementation of a strain-inducing semiconductor alloy in the active regions of transistors and providing sophisticated high-k metal gate electrode structures on the basis of a replacement gate approach.

One illustrative semiconductor device disclosed herein comprises a semiconductor region comprising an embedded strain-inducing semiconductor alloy that is formed at least partially in drain and source regions. The semiconductor device further comprises a gate electrode structure formed on a portion of the semiconductor region and comprising a metal-containing electrode material and a high-k dielectric material. Furthermore, the semiconductor device comprises contact areas formed above the strain-inducing semiconductor alloy and comprising a metal silicide having a top surface at a height that substantially corresponds to a height of a top surface of the metal-containing electrode material.

A further illustrative semiconductor device disclosed herein comprises a semiconductor region of a first transistor comprising a strain-inducing semiconductor alloy and a strained semiconductor material that is laterally enclosed by the strain-inducing semiconductor alloy, wherein the strained semiconductor material and the strain-inducing semiconductor alloy differ in their material compositions. The semiconductor device further comprises a gate electrode structure formed on a portion of the semiconductor region and comprising a metal-containing electrode material, a high-k dielectric material and a spacer structure that is aligned to the strained semiconductor material.

In yet another illustrative embodiment, a semiconductor device is disclosed that includes an isolation structure laterally isolating an active region of the semiconductor device and a plurality of transistor elements positioned in and above the active region, each of the plurality of transistor elements having a gate electrode structure that includes a high-k gate dielectric material and a metal-containing electrode material. The illustrative semiconductor device further includes, among other things, a plurality of material regions, each including a lower strain-inducing portion that is embedded in one of a source region and a drain region of a respective one of the plurality of transistor elements, wherein the lower strain-inducing portion includes a first semiconductor material. Additionally, each of the plurality of material regions also includes an upper contact portion that extends above the active region, the upper contact portion including a second semiconductor material and a metal silicide, wherein a height level of a top surface of the upper contact portion substantially corresponds to a height level of a top surface of the metal-containing electrode material.

BRIEF DESCRIPTION OF THE DRAWINGS

The disclosure may be understood by reference to the following description taken in conjunction with the accompanying drawings, in which like reference numerals identify like elements, and in which:

FIGS. 1a-1p schematically illustrate cross-sectional views of a semiconductor device during various manufacturing stages, wherein one or more strain-inducing semiconductor alloys may be provided laterally homogeneously in active regions of transistors in an early manufacturing stage, i.e., prior to providing gate electrode structures, while a strained central portion of the active regions and thus the channel regions may be provided in a late manufacturing stage on the basis of a gate opening that is provided upon removing a placeholder material of a gate electrode structure based on a replacement gate approach, according to illustrative embodiments; and FIGS. 2a-2k schematically illustrate cross-sectional views of a semiconductor device during various manufacturing stages, in which a strain-inducing semiconductor alloy may be formed on the basis of contact openings that may be provided prior to replacing a placeholder material with at least a metal-containing electrode material, according to further illustrative embodiments.

Figure 2A:
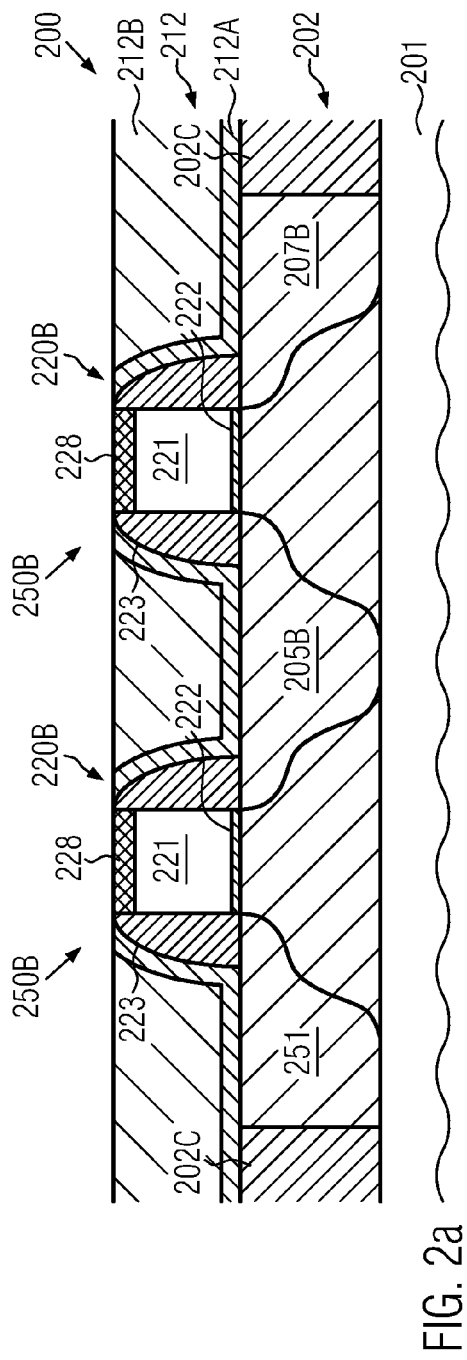

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which sophisticated replacement gate approaches and processes for providing an embedded strain-inducing semiconductor material in the active regions of transistors may be appropriately "correlated" or "combined" in order to provide superior device performance and/or manufacturing efficiency. To this end, the replacement gate electrode structure, i.e., the gate electrode structure prior to providing at least the metal-containing electrode material, may be used for forming at least one cavity in the active region of the transistor under consideration in order to obtain, after refilling the at least one cavity, at least partially, by any appropriate semiconductor material, a desired high strain component in the central portion and thus in the channel region of the transistor under consideration. In some aspects, this may be accomplished by providing a laterally homogeneously formed strain-inducing semiconductor alloy, such as a silicon/germanium material, a silicon/carbon material and the like, in the active regions of P-channel transistors and/or N-channel transistors in a very early manufacturing stage, thereby providing superior process conditions and enhanced process efficiency, since corresponding gate electrode structures may be formed in a later manufacturing stage, thereby avoiding complex processes for covering gate electrode structures. On the other hand, a cavity may be formed on the basis of a gate opening obtained during a replacement gate approach so that a precisely aligned portion of the previously provided strain-inducing semiconductor alloy may be removed and may be replaced by any appropriate semiconductor material, which may thus have the desired overall electronic characteristics and which may also have a significant strain component due to the close proximity of the previously provided strain-inducing semiconductor alloy. In some illustrative embodiments, active regions with different strain-inducing materials may be provided in an early manufacturing stage, and the cavities and semiconductor materials may be formed on the basis of a common process sequence, thereby obtaining a different type of strain in the different active regions, while nevertheless providing a very efficient process technique. Furthermore, upon controlling the selective epitaxial growth process for filling the central cavity in the various active regions, a certain degree of well doping, at least for one type of transistor, may be implemented, while, in other cases, the effective channel length may be adjusted, for instance by refilling the central cavity only partially to a specific height prior to forming a gate dielectric material and a metal-containing electrode material.

In still other illustrative embodiments disclosed herein, the strain-inducing semiconductor alloy may be provided in a very late manufacturing stage, i.e., upon forming contact openings in a portion of the interlayer dielectric material prior to actually performing the replacement gate approach. In some cases, the contact openings may be provided differently for transistors of different conductivity type, thereby efficiently allowing the implementation of different types of strain-inducing semiconductor alloys, while also enabling a dedicated adaptation of the material in terms of dopant concentration, material composition, fill height and the like. Thereafter, the contact elements, which may comprise, for instance, a metal silicide, may be efficiently used for providing superior process conditions during the subsequent replacement gate approach, for instance by exposing the placeholder material, defining a desired height of the high-k metal gate electrode structures and the like.

With reference to FIGS. 1a-1p, illustrative embodiments will now be described in which one or more strain-inducing semiconductor materials may be provided in active regions of transistors prior to forming a gate electrode structure, wherein the actual strained semiconductor material having the desired electronic characteristics for a channel region may be provided in a very late manufacturing stage, i.e., upon performing a replacement gate approach.

FIG. 1a schematically illustrates a cross-sectional view of a semiconductor device 100 comprising a substrate 101 and a semiconductor layer 102, such as a silicon layer and the like. The semiconductor layer 102 and the substrate 101 may form a "bulk" configuration, wherein the semiconductor material of the layer 102 represents a portion of a crystalline substrate material of the substrate 101. In other illustrative embodiments, a buried insulating material (not shown) may be provided between the substrate 101 and the semiconductor layer 102, thereby forming an SOI (silicon-on-insulator) configuration. Furthermore, in the manufacturing stage shown, a mask 103, which may also be referred to as a hard mask, may be provided above the semiconductor layer 102 and may have any appropriate configuration so as to withstand the conditions during the further processing upon forming one or more strain-inducing semiconductor materials in dedicated areas of the semiconductor layer 102. For example, the hard mask 103 may be comprised of silicon nitride, possibly in combination with a thin etch stop material, such as a silicon dioxide material (not shown) and the like. Furthermore, an etch mask 104, such as a resist mask, may be provided above the hard mask 103 and may be patterned so as to grossly define the lateral size and position of one or more active regions 105A, 105B. In this respect, it should be appreciated that the term "grossly" is to be understood as describing the lateral size and position of active regions in combination with any additional isolation structures, which may be provided in a later manufacturing stage so as to actually define the size and position of the active regions 105A, 105B within the semiconductor layer 102. It should further be appreciated that the areas 105A, 105B may correspond to active regions of transistors of different conductivity type so that, for instance, the active region 105A may correspond to one or more N-channel transistors, while the active region 105B may correspond to one or more P-channel transistors. It should be appreciated, however, that the principles disclosed herein may apply to any type of transistors and may also be applied to dedicated transistors of the device 100, such as N-channel transistors or P-channel transistors or selected N-channel and P-channel transistors, and the like.

The semiconductor device 100 as illustrated in FIG. 1a may be formed on the basis of the following processes. The hard mask 103 may be formed on the basis of well-established deposition techniques, such as thermally activated chemical vapor deposition (CVD), plasma enhanced CVD and the like, for which a plurality of appropriate recipes are available in the art, for instance for forming silicon nitride material, silicon oxynitride and the like. Similarly, an etch stop material (not shown), if required, may be formed on the basis of oxidation, deposition and the like. Thereafter, the etch mask 104 may be provided and may be patterned on the basis of appropriate lithography techniques.

FIG. 1*b* schematically illustrates the semiconductor device 100 when exposed to the reactive etch ambient of an etch process or process sequence 106. The etch process 106 may comprise appropriate etch steps for etching through the hard mask 103, for instance by using plasma assisted etch recipes, wherein, for instance, silicon nitride may be etched selectively with respect to silicon, silicon dioxide and the like. Consequently, during a first phase of the process 106 or during the first step, the hard mask 103 may be patterned in accordance with the etch mask 104. Thereafter, the process or sequence 106 may be continued by selecting an appropriate etch chemistry for etching into the semiconductor layer 102, thereby forming a recess 102B therein. To this end, a plurality of well-established etch chemistries, for instance based on plasma assisted recipes, are available to etch silicon material in a highly controllable manner. During the etch process 106, when an SOI configuration is considered, i.e., when a buried insulating material (not shown) may be provided below the semiconductor layer 102, a remaining material layer 102D may be preserved so as to provide an appropriate "seed" layer for a subsequent selective epitaxial growth process. For example, the remaining material 102D may be preserved with a thickness of 5-20 nm or higher, depending on process and device specifics.

FIG. 1*c* schematically illustrates the semiconductor device 100 in a further advanced manufacturing stage. As illustrated, after the removal of the etch mask 104 (FIG. 1*b*) and performing any cleaning processes for providing superior surface conditions, the device 100 may be exposed to a selective epitaxial growth process 107. As is well known, during a selective epitaxial growth process, the process parameters may be selected such that a significant material deposition occurs on exposed surface areas of the seed material only, while any pronounced material deposition on other surface areas, such as the hard mask 103, may be suppressed. Consequently, during the process 107 a desired strain-inducing semiconductor alloy may be growth within the recess 102B based on the remaining material layer 102D, which may thus provide the desired lattice mismatch between a strain-inducing semiconductor alloy 107B and the material of the layer 102, thereby obtaining the desired high strained state of the material 107B. It should be appreciated that the material 107B may also be referred to as a strain-inducing semiconductor material, since it may induce a desired type of strain in dedicated portions of the active region 105B in a later manufacturing stage in order to enhance performance of one or more transistors by increasing charge carrier mobility in the corresponding channel regions, as is also explained above. For example, the material 107B may comprise a silicon/germanium mixture or alloy, wherein the germanium fraction may be up to 30 atomic percent or higher, which may result in a pronounced strained state. In other cases, other atomic species, such as tin and the like, may be incorporated into the material 107B, if considered appropriate. The strain material 107B may thus be provided as a laterally homogeneous material within the active region 105B, contrary to conventional approaches, in which typically an embedded strain-inducing semiconductor material may be provided in corresponding cavities formed laterally adjacent to a gate electrode structure. Thus, in general, superior process conditions may be accomplished upon forming the material 107B, due to superior surface topography of the device 100 and the like.

FIG. 1*d* schematically illustrates the device 100 in a further advanced manufacturing stage in which a further etch mask 108, such as a resist mask, may be provided so as to expose a portion of the hard mask 103, which may approximately correspond to the active region 105A. To this end, any well-established lithography techniques may be applied.

FIG. 1*e* schematically illustrates the semiconductor device 100 when exposed to a reactive etch ambient of a process or process sequence 109. During the process 109, the hard mask 103 may be patterned on the basis of the etch mask 108 (FIG. 1*d*) and thereafter the etch process may be continued by etching into the semiconductor layer 102, thereby forming a recess 102A therein. With respect to any characteristics of the etch process 109, the same criteria may apply as previously explained with reference to the etch process 106 of FIG. 1*b*. Also in this case, after opening the hard mask 103, a highly controllable etch step may be applied during the process 109, thereby enabling a desired adjustment of the depth of the recess 102A and thus a thickness of the remaining semiconductor material 102D. It should be appreciated that, if desired, the material 102D may be provided with different thicknesses in the recesses 102A, 102B if considered advantageous in view of the further processing and the finally obtained device characteristics.

FIG. 1*f* schematically illustrates the semiconductor device 100 in a further advanced manufacturing stage. As illustrated, the device 100 is exposed to a selective deposition ambient 110 in order to selectively deposit material within the recess 102A (FIG. 1*e*) substantially without depositing any material on the exposed strained material 107B and any dielectric surface areas, such as surface areas of the hard mask 103. For example, during the process 110, a second type of strained semiconductor material 110A may be deposited, for instance in the form of a silicon/carbon mixture and the like, which may provide a different type of strained state compared to the material 107B. In other illustrative embodiments (not shown), when the selectivity between the seed material 102D in the active region 105A is considered insufficient with respect to the material 107B during the selective deposition process 110, a desired hard mask material may be formed, for instance by oxidation and the like, on the material 107B in a state when the hard mask 103 may still cover the active region 105A, as is for instance shown in FIG. 1*c*. For example, a thin oxide material may be formed on or within the material 107B prior to performing the selective epitaxial growth process 110. Thereafter, if required, the corresponding deposition mask may be selectively removed from the material 107B by any appropriate selective etch chemistry, for instance based on wet chemical etch recipes and the like.

FIG. 1*g* schematically illustrates the device 100 in a further advanced manufacturing stage. As illustrated, after the removal of the hard mask 103 (FIG. 1*f*), a further mask 111 may be provided so as to define the lateral position and size of any isolation structures to be formed in the semiconductor layer 102 and within the strained semiconductor materials 107B, 110A. As illustrated, a plurality of trenches 111C may be defined by the mask 111, which may comprise two or more individual material layers, such as silicon dioxide, silicon nitride and the like. To this end, any well-established process strategies may be applied for depositing appropriate materials and patterning the same on the basis of sophisticated lithography techniques. Thereafter, the materials 110A, 107B and 102 may be patterned on the basis of the mask 111, for instance using well-established anisotropic etch techniques for transferring the trenches 111C into the underlying materials. Thereafter, an appropriate insulating material, such as silicon dioxide and the like, may be filled into the trenches and any excess material may be removed for instance by chemical mechanical polishing (CMP), followed by the removal of any excess material of the mask 111.

FIG. 1h schematically illustrates the semiconductor device 100 after completing the above-described process sequence. Consequently, the final lateral size and position of the active regions 105A, 105B may be now defined by shallow trench isolations 102C, which may be obtained on the basis of the above-described process sequence.

FIG. 1i schematically illustrates the semiconductor device 100 with superior surface topography, i.e., after performing a further CMP process in order to efficiently remove any extra height of the isolation structure 102C. Consequently, in this manufacturing stage, the strain-inducing materials 107B, 110A may be provided as laterally homogeneous materials having a substantially planar surface topography, while also the height of the shallow trench isolations 102C may be substantially equal to the height of the materials 107B, 110A, thereby providing superior process conditions for the further processing, i.e., the deposition of gate materials and the patterning of these materials.

FIG. 1j schematically illustrates the semiconductor device 100 in a further advanced manufacturing stage. As shown, a first transistor 150A, such as an N-channel transistor, may be formed on the active region 105A (FIG. 1i), that is, in and above the strain-inducing material 110A, while a second transistor 150B, such as a P-channel transistor, may be formed on the active region 105B (FIG. 10, that is, in and above the strain-inducing material 107B. In the manufacturing stage shown, the transistor 150A may comprise a gate electrode structure 120A, which may comprise a "gate dielectric material" 122, for instance in the form of a silicon dioxide material, a silicon oxynitride material and the like, which is, however, to be replaced in a later manufacturing stage in order to provide a gate dielectric layer including a high-k dielectric material. Furthermore, a placeholder material 121, such as a polysilicon material and the like, may be formed above the dielectric layer 122. The placeholder material 121 may, if required, comprise an additional dielectric cap material (not shown), for instance in the form of silicon dioxide, silicon nitride and the like. Furthermore, the gate electrode structure 120A may comprise a spacer structure 123 having any appropriate configuration in accordance with the overall device and process requirements. That is, a width and composition of the spacer structure 123 may be selected such that a desired lateral and vertical dopant profile for drain and source regions 151 may be achieved. It should be appreciated that the spacer structure 123 may comprise any number of individual spacer elements, possibly in combination with any etch stop materials and the like.

Similarly, a gate electrode structure 120B of the transistor 150B may comprise basically the same components as the gate electrode structure 120A, wherein superior uniformity may be achieved, for instance, with respect to critical dimensions of the gate electrode structures 120A, 120B and the like, due to the superior surface conditions and due to the very symmetric process history of the gate electrode structures 120A, 120B compared to conventional process strategies, in which increased complexity may occur upon providing a strained semiconductor alloy after forming the gate electrode structures 120A, 120B.

The semiconductor device 100 as shown in FIG. 1j may be formed on the basis of the following processes. Beginning with the configuration as shown in FIG. 1i, the materials for the layers 122 and 121, in combination with any additional sacrificial materials, such as hard mask materials and the like, may be deposited on the basis of well-established deposition techniques, followed by a patterning sequence using sophisticated lithography and etch processes. In this manner, the lateral dimensions of the gate electrode structures 120A, 120B may be defined, for instance, with a critical dimension of approximately 50 nm and less, which may correspond basically to the horizontal extension of the placeholder material 121 in FIG. 1j, wherein it may be appreciated that the critical dimension may be further reduced during the further processing upon providing an appropriate gate dielectric material, as will be explained later on in more detail. Thereafter, appropriate dopant species may be incorporated into the materials 110A, 107B by using appropriate masking regimes, while the spacer structure 123 may also be used as an implantation mask during any intermediate manufacturing stage of the structure 123. It should be appreciated that the implantation parameters and the spacer structure 123 may be designed so as to obtain, in combination with any subsequent anneal processes, a desired vertical and lateral dopant profile, which may also take into account the removal of a central portion of the materials 107B, 110A in a further advanced manufacturing stage. That is, the drain and source regions 151 and any counterdoped areas or halo regions (not shown) may be provided such that an appropriate connection of the drain and source region 151 to a channel region may be accomplished, which may be provided in a later manufacturing stage upon replacing a central portion of the materials 110A, 107B after the removal of the placeholder material 121 of the gate electrode structures 120A, 120B.

FIG. 1k schematically illustrates the semiconductor device 100 in a manufacturing stage in which an interlayer dielectric material 112 may be provided so as to laterally enclose the gate electrode structures 120A, 120B. The interlayer dielectric material 112 may be provided in the form of one or more material layers, such as a silicon nitride material, a silicon dioxide material and the like, or any combination thereof, depending on the overall process and device requirements. In some illustrative embodiments, the interlayer dielectric material 112 may comprise a highly stressed material portion in order to further increase the total strain in one or both of the transistors 150A, 150B, which may be accomplished by selectively providing a highly stressed dielectric material in the vicinity of the transistor 150A and/or providing a highly stressed dielectric material portion of a different type in the vicinity of the transistor 150B within the interlayer dielectric material 112.

The interlayer dielectric material 112 may be provided on the basis of any well-established process strategies, for instance depositing a silicon nitride material, if required, followed by the deposition of a silicon dioxide material, which may represent a well-established interlayer dielectric material. As discussed above, one or more of these material layers may be provided in the form of a highly stressed material, at least in the vicinity of one of the transistors 150A, 150B. To this end, well-established plasma enhanced CVD techniques may be applied for forming a silicon nitride material having a high internal tensile or compressive stress, wherein an appropriate masking and patterning regime may be applied so as to position the material having the desired stress component at the appropriate transistor for enhancing the overall performance thereof. After providing the interlayer dielectric material 112, any excess portion thereof may be removed, for instance by CMP, etching and the like, or a combination of any of these process strategies, thereby finally exposing a top surface 121S of the placeholder material 121. It should be appreciated that in some cases, as discussed above, the material 121 may comprise a dielectric cap material, which may also be exposed and be removed so as to finally expose the top surface 121S having the desired etch characteristics. Thereafter, a highly selective etch process 113 may be applied, for instance based on plasma assisted processes and/or wet chemical etch processes, in order to remove the placeholder material 121 selectively with respect to the interlayer dielectric material 112 and the spacer structure 123. For example, a plurality of very selective etch chemistries for removing polysilicon material are available. For instance, the etch process 113 may be performed on the basis of tetramethylammonium hydroxide (TMAH) which may efficiently remove silicon material selectively with respect to silicon nitride, silicon dioxide, metal silicides and the like. During the etch process 113, the dielectric layer 122, if provided, may be used as an efficient etch stop material, which may then be removed on the basis of any appropriate selective etch recipe, such as hydrofluoric acid and the like.

FIG. 1*l* schematically illustrates the semiconductor device 100 in a further advanced manufacturing stage, in which gate openings 124 are provided in the gate electrode structures 120A, 120B due to the removal of the materials 121 and 122 (FIG. 1*k*) during the above-described process sequence. Furthermore, the device 100 is exposed to a further reactive etch ambient 114, which is appropriately configured so as to remove exposed portions of the materials 107B, 110A. To this end, a plurality of selective etch recipes are available in which silicon-based semiconductor materials may be removed selectively with respect to silicon dioxide, silicon nitride and the like. Thus, in some illustrative embodiments, the etch process 114 may be performed as a highly anisotropic etch process so that the gate openings 124 may be used as efficient masks in order to appropriately align the advance of the etch process to the gate openings 124 and thus to the sidewall spacer structure 123.

FIG. 1*m* schematically illustrates the device 100 in an advanced manufacturing stage in which cavities 114A, 114B may be formed in the active regions 105A, 105B, respectively, on the basis of the mask openings 124. In the embodiment shown, the cavities 114A, 114B may have substantially the lateral dimensions of the mask openings 124 and thus of the lateral distance defined by the sidewall spacer structure 123, while a depth may be selected such that the cavities 114A, 114B may extend into the remaining material 102D of the initial semiconductor layer 102.

FIG. 1*n* schematically illustrates the device 100 during a further selective epitaxial growth process 115C, in which a semiconductor material 115 is formed in the cavities 114A, 114B (FIG. 1*m*) through the gate openings 124. The semiconductor material 115 may be formed as a strained semiconductor material, for instance in the form of a silicon base material, which may have an internal strain component that is determined by the surrounding materials 110A and 107B, respectively. During the selective epitaxial growth process 115C, process parameters may be selected in accordance with well-established recipes such that a significant deposition may occur on horizontal surface areas of the remaining semiconductor material 102, which may be crystal (100) surface, corresponding to a standard crystallographic configuration of silicon-based semiconductor devices, thereby obtaining a very similar growth rate for the transistors 150A, 150B, respectively. Hence, the desired fill height of the material 115 may be controlled so as to be substantially identical in the transistors 150A, 150B, thereby enabling the adjustment of the finally achieved channel length of the transistors 150A, 150B during the common selective deposition process 115C. For example, in the embodiment shown, the semiconductor material 115 may be provided with a fill height which may substantially correspond to the initial height of the materials 110A, 107B, respectively, thereby obtaining a final channel length, which may substantially correspond to the critical dimensions of the gate openings 124 plus an extra width, which may be contributed by a gate dielectric material still to be formed in the gate opening 124. In other cases, the fill height of the material 115 may be less than shown in FIG. 1*n*, thereby effectively increasing the resulting channel length. It should be appreciated that, during the selective epitaxial growth process 115C, an additional dopant species or other atomic species may also be incorporated into the material 115, if considered appropriate. For example, in illustrative embodiments (not shown), the process 115C may be performed for one type of transistors and thus any well dopant species and/or channel dopant species may be incorporated in order to obtain the desired electronic characteristics of the material 115 and thus of a corresponding channel region. On the other hand, any other transistors may be appropriately masked by a hard mask material, if a corresponding in situ doped material 115 may be considered inappropriate for the masked transistors. Thereafter, a corresponding sequence may be applied by replacing the previously provided hard mask with another mask in order to refill any further cavities with an appropriately designed semiconductor material. It should further be appreciated that not necessarily each of the transistors 150A, 150B may have provided therein the strain-inducing materials 107B, 110A. In this case, the material 115 may be provided for a strain-inducing material in a substantially stress neutral active region, while, in other illustrative embodiments, the strain-inducing semiconductor material may be provided in one type of transistor, such as the N-channel transistor 150A, in the form of a strained silicon material, which may be obtained on the basis of stress memorization techniques (SMT), in which a substantially amorphous silicon material in the drain and source areas may be re-crystallized in the presence of an overlayer, such as a silicon nitride layer, thereby causing the silicon material to regrow in a substantially tensile strained state, which may also be preserved upon removing the overlayer completely or partially.

FIG. 1*o* schematically illustrates the semiconductor device 100 in a further advanced manufacturing stage. As illustrated, a hard mask 116 may be provided so as to cover the transistor 150B while exposing the transistor 150A. Moreover, a gate dielectric layer 125A may be formed on the interlayer dielectric material 112 and the hard mask 116 and within the gate electrode structure 120A. Thus, the gate dielectric layer 125A may also be formed on the previously formed strained semiconductor material 115, a portion of which, indicated by 152, may be considered as a channel region. The gate dielectric layer 125A may be comprised of any appropriate dielectric material including a high-k dielectric material, which is to be understood as a dielectric material having a dielectric constant of 10.0 and higher. For example, a plurality of metal oxides may have a moderately high permittivity and may be used as high-k dielectric materials, for instance in the form of hafnium oxide, hafnium silicon oxide, zirconium oxide, aluminum oxide and the like. In some illustrative embodiments, the gate dielectric layer 125A may also comprise a "conventional" dielectric material, for instance in the form of a silicon oxide material, a silicon oxynitride material and the like, if superior interface characteristics with respect to the channel region 152 are considered appropriate. The gate dielectric layer 125A may be provided such that a desired high capacity for coupling may be accomplished, while at the same time a sufficient physical thickness may keep the resulting leakage currents at an acceptable level. Moreover, a metal-containing electrode material 126A may be provided, for instance in the form of titanium nitride, tantalum nitride, aluminum and the like, wherein the layer 126A may also have incorporated therein an appropriate metal species, which may result in a desired work function of the gate electrode structure 120A.

Moreover, a highly conductive gate metal 127A, such as aluminum, aluminum alloys and the like, may be provided above the layer 126A. It should be appreciated that the layer stack 125A, 162A, 127A may represent any appropriate material system for providing the components of a sophisticated high-k metal gate electrode structure. The material system 125A, 126A, 127A may be formed on the basis of any appropriate deposition techniques, such as atomic layer deposition (ALD), sputter deposition, CVD, electrochemical deposition, for instance for the material 127A, and the like. After the deposition of the materials 125A, 126A, 127A, any excess portion thereof may be removed, for instance by first performing a CMP process for providing a superior surface topography, and thereafter performing a selective etch process, for instance by using selective wet chemical etch recipes and the like. Thereafter, the hard mask 116 may be removed, for instance by any appropriate selective etch process, wherein the materials 127A, 126A and 125A may have a significantly reduced etch rate, thereby acting as etch stop materials. Consequently, integrity of the gate electrode structure 120A may be preserved during the removal of the hard mask 116.

FIG. 1p schematically illustrates the semiconductor device 100 in a further advanced manufacturing stage. As shown, a further hard mask 117 may cover the transistor 150A comprising the gate electrode structure 120A, which now represents a sophisticated high-k metal gate electrode structure including the components described above with reference to FIG. 1o. Furthermore, the gate electrode structure 120B of the transistor 150B may comprise a gate dielectric layer 125B, representing a high-k dielectric material, possibly in combination with a conventional dielectric material, as discussed above, a metal-containing electrode material 126B and a highly conductive electrode material 127B. The materials 125B, 126B, 127B may be deposited on the basis of similar process strategies as described above with reference to the gate electrode structure 120A. It should be appreciated that, for example, the materials 125A and 125B may have substantially the same configuration, except for any work function adjusting species, which may be incorporated therein, for instance, by any preceding heat treatment and the like. Similarly, the highly conductive metal 127A, 127B may have substantially the same material composition, while, if required, the materials 126A, 126B may differ in order to adjust the appropriate work function of the gate electrode structures 120A, 120B. After the deposition of the materials of the gate electrode structure 120B, any excess part may be removed, for instance as described above, and thereafter the hard mask 117 may be removed by using any selective etch recipes and the like.

Consequently, one or both of the transistors 150A, 150B may be provided with the channel region 152 formed in the strained semiconductor material 115, which may have a high internal strain due to the close proximity to the materials 107B, 110A, respectively. Moreover, the transistors 150A, 150B, and in particular the gate electrode structures 120A, 120B, may be provided in an early manufacturing stage on the basis of superior process conditions due to the substantially planar surface topography due to the incorporation of the strain-inducing materials 110A, 107B in an early manufacturing stage, i.e., prior to actually forming the shallow trench isolations 102C, thereby avoiding pronounced topography modifications of the isolation structures 102C, which may conventionally be caused by the processing for incorporating an embedded strain-inducing semiconductor alloy.

With reference to FIGS. 2a-2k, further illustrative embodiments will now be described in more detail, wherein cavities for incorporating a strain-inducing semiconductor alloy may be provided in a very late manufacturing stage.

FIG. 2a schematically illustrates a cross-sectional view of a semiconductor device 200 comprising a substrate 201 and a semiconductor layer 202, wherein the substrate 201 and the layer 202 may represent an SOI configuration or a bulk configuration, as is also previously explained with reference to the semiconductor device 100. Moreover, in the manufacturing stage shown, the semiconductor layer 202 may comprise an isolation structure 202C, such as a shallow trench isolation, which may define the lateral position and size of active regions in the semiconductor layer 202, such as an active region 205B. Generally, an active region is to be understood as a semiconductor region, in and above which one or more transistor elements are to be formed. In the example shown in FIG. 2a, the active region 205B may be appropriately configured so as to accommodate a plurality of transistors 250B, such as P-channel transistors, while, in other cases, a single transistor may be formed in and above the active region 205B, as will also be described later on. The transistors 250B may comprise corresponding gate electrode structures 220B, which in turn may include a dielectric material 222, a placeholder material 221, for instance in the form of a polysilicon material, possibly in combination with a dielectric cap material 228, such as a silicon nitride material, a silicon dioxide material and the like. Furthermore, gate electrode structures 220B may comprise a spacer structure 223, which may be used for defining the lateral and vertical dopant profile of drain and source regions 251 formed in the active region 205B. With respect to any critical dimensions of the gate electrode structures 220B, the same criteria may apply as previously discussed with reference to the semiconductor device 100. It should further be appreciated that the gate electrode structures 220B, and, if desired, any other gate electrode structures, may be formed on the basis of superior process conditions, since any strain-inducing semiconductor material may be formed in a later manufacturing stage.

Moreover, in the manufacturing stage shown, an interlayer dielectric material 212 may be provided so as to laterally enclose the gate electrode structures 220B. For example, in the embodiment shown, the interlayer dielectric material 212 may comprise a first dielectric layer 212A, such as a silicon nitride layer, which may be provided with a high internal stress level, if desired. Moreover, a second dielectric layer 212B, such as a silicon dioxide material, may be provided. With respect to any process strategies for forming the transistors 250B and the gate electrode structures 220B, it may be referred to the corresponding process strategies described above with respect to the semiconductor device 100. After completing the basic transistor configuration, the interlayer dielectric material 212 may be formed and an excess portion thereof may be removed, for instance by CMP, thereby providing a substantially planarized surface topography and also exposing the dielectric cap layers 228.

Figure 2B:
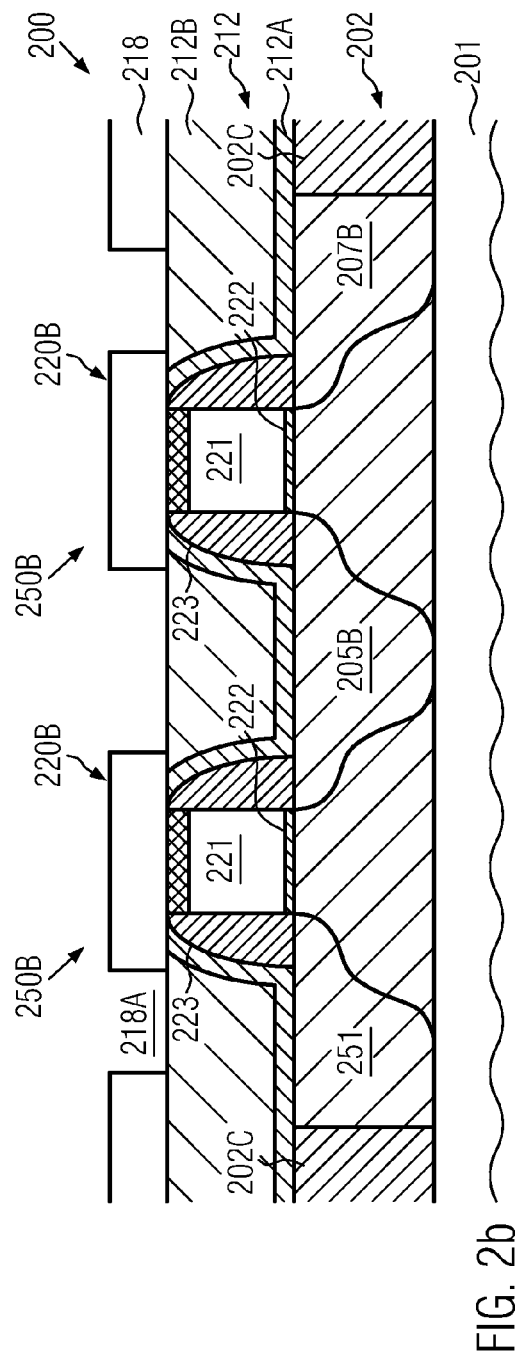

FIG. 2b schematically illustrates the semiconductor device 200 in a further advanced manufacturing stage, in which an etch mask 218, such as a resist mask, a hard mask or any combination thereof, may be provided, wherein mask openings 218A may define the lateral size and position of contact openings to be formed in the interlayer dielectric material 212 for the transistors 250B. That is, in some illustrative embodiments, the mask 218 may be formed so as to cover other transistors, such as N-channel transistors and the like, while specifically providing the mask openings 218A for the transistors 250B.

Figure 2C:
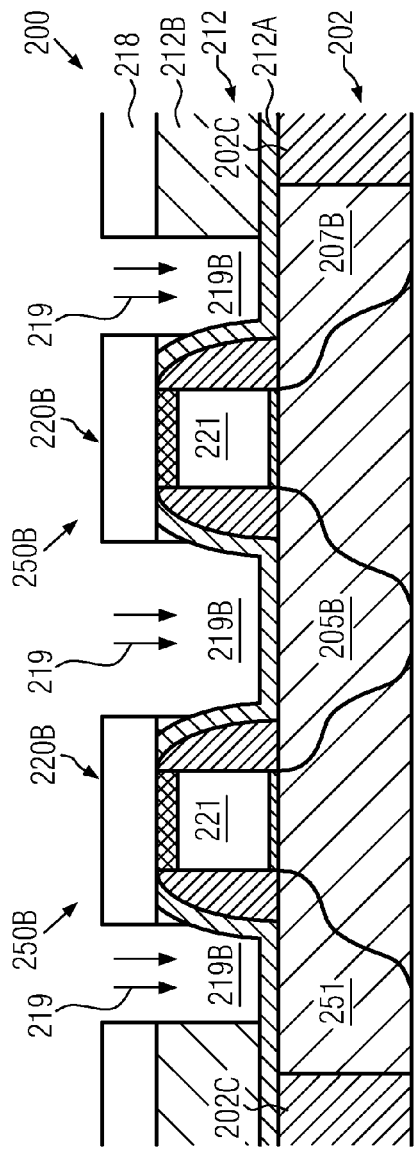

FIG. 2c schematically illustrates the semiconductor device 200 during an etch process 219 that may be performed on the basis of the etch mask 218 in order to form contact openings 219B in the interlayer dielectric material 212B. To this end, any appropriate plasma assisted etch recipes may be applied during the process 219, in which, for instance, silicon dioxide material may be etched selectively with respect to silicon nitride material. Thus, the dielectric layer 212A may act as an efficient etch stop material. Consequently, for any contact openings 219B formed between two of the gate electrode structures 220B, the etch process 219 may result in a self-aligned etch behavior due to the etch stop capabilities of the layer 212A.

Figure 2D:
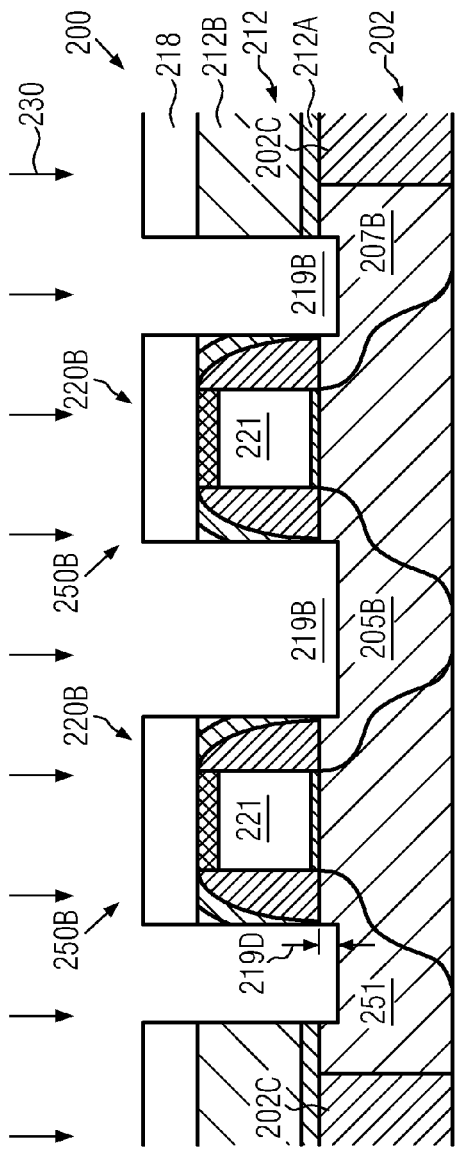

FIG. 2d schematically illustrates the semiconductor device 200 during a further etch process 230, in which the material of the layer 212A may be etched so as to increase the depth of the contact openings 219B. Moreover, the etch process 230 may also comprise an etch step for etching into the active region 205B, thereby defining a vertical extension 219D of the contact openings 219B, with which the openings 219B extend into the active region 205B. As previously explained with reference to the semiconductor device 100, a plurality of well controllable plasma assisted etch recipes are available in order to remove silicon material, thereby providing a high degree of uniformity upon determining the vertical extension 219D. Thereafter, the etch mask 218 may be removed, for instance by well-established resist strip processes or any other removal processes, as required for etching the material of the etch mask 218.

Figure 2E:
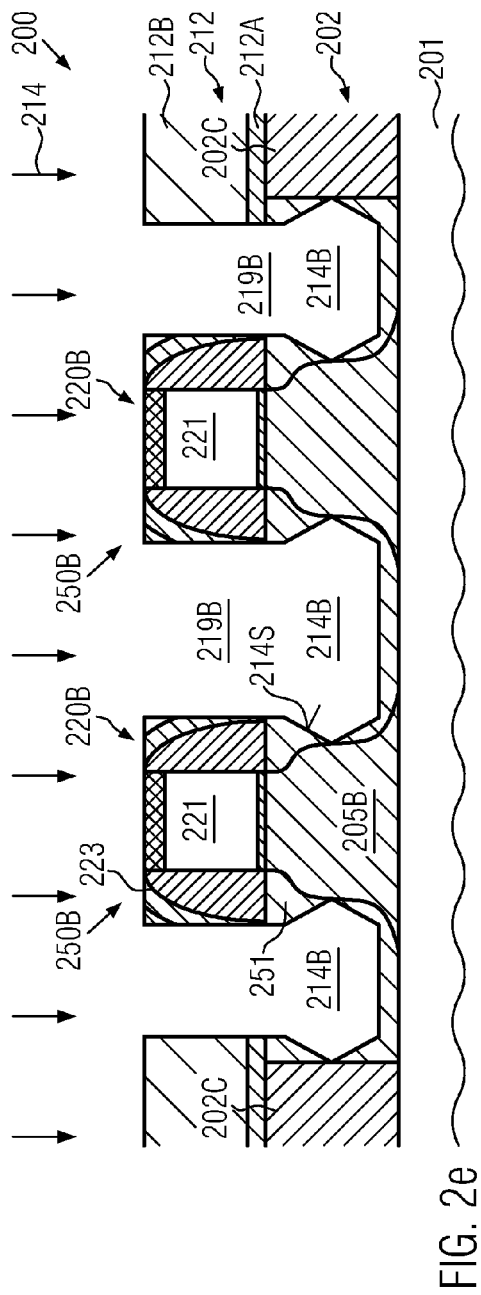

FIG. 2e schematically illustrates the semiconductor device 200 in a further advanced manufacturing stage, in which cavities 214B may be formed on the basis of an etch process, thereby using the contact openings 219B as efficient mask openings. In some illustrative embodiments, as shown, the etch process 214 may be performed on the basis of a wet chemical etch recipe having a crystallographically anisotropic etch behavior. That is, a plurality of well-known etch recipes are available, in which the etch rate may depend on the crystallographic orientation of crystal planes. For example, specific etch recipes may be available, in which (111) crystallographic planes may act as efficient etch stop planes, thereby obtaining a self-restricting lateral etch rate for a standard crystallographic configuration of the material of the active region 205B. In this case, the cavities 214B may be referred to as "sigma" shaped cavities having inclined surface areas 214S, which may thus restrict the lateral etch rate and thus define the degree of under-etching of the gate electrode structure 220B, i.e., of the spacer structure 223. Consequently, for given lateral dimensions of the gate electrode structures 220B and of the active region 205B, the cavities 214B having a well-defined degree of under-etching may be provided, for instance by controlling the final depth of the contact openings 219B and using a crystallographically anisotropic etch chemistry. For example, TMAH may be efficiently used for anisotropically etching a silicon material with a high degree of selectivity with respect to silicon dioxide, silicon nitride and the like. In other illustrative embodiments, the cavities 214B may be formed with a certain degree of under-etching by applying an isotropic etch chemistry, for instance a plasma assisted etch chemistry, a wet chemical etch chemistry, wherein the lateral degree of under-etching may be determined by controlling the total etch time. Moreover, since the cavities 214B may be specifically designed so as to comply with the requirements of the transistors 250B, while other transistors may be efficiently covered by the non-patterned interlayer dielectric material 212, the size and shape of the cavities 214B may also be selected so as to obtain the desired transistor characteristics upon refilling the cavities 214B with a desired strain-inducing semiconductor material, which may also comprise any dopant species and the like. For example, the cavities 214B may be selected in size and shape such that a desired "connection" to the remaining drain and source regions 251 may be obtained in view of the overall performance of the transistors 250B. On the other hand, a removal of any previously provided drain and source dopants by forming the cavities 214B may be less critical, since the corresponding dopant species may be efficiently replaced during the subsequent refilling of the cavities 214B, while, in other cases, even a superior degree of dopant concentration with reduced lattice damage may be achieved.

Figure 2F:
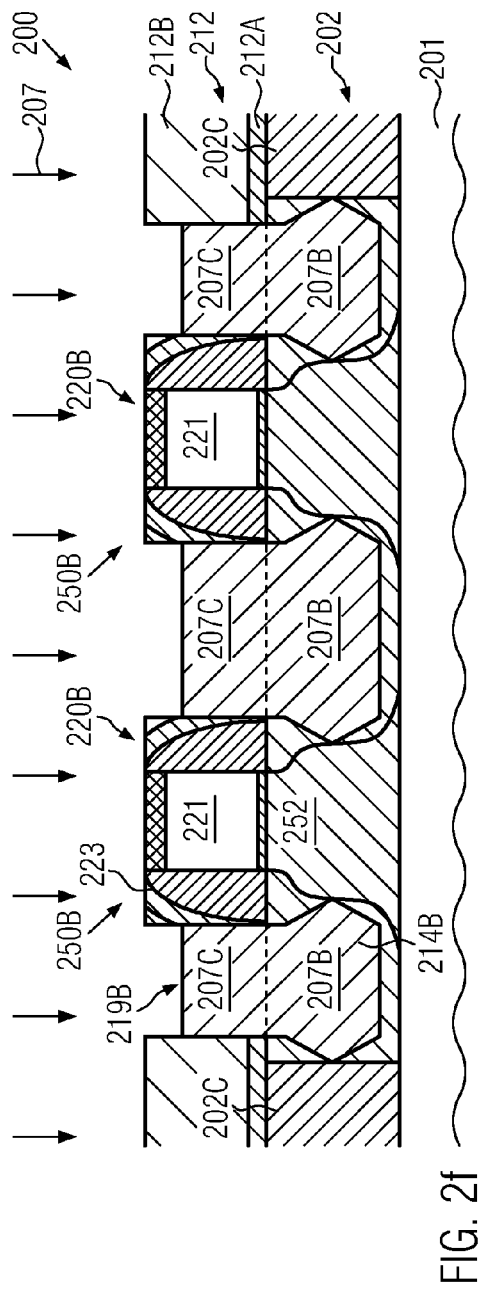

FIG. 2f schematically illustrates the device 200 in a further advanced manufacturing stage, i.e., during a selective epitaxial growth process 207, during which at least the cavities 214B may be filled with a strain-inducing semiconductor material 207B, such as a silicon/germanium mixture, a silicon/carbon material and the like, depending on the desired type of strain required for the transistors 250B. To this end, well-established deposition recipes may be applied for the process 207, as is also discussed above. Moreover, the selective epitaxial growth process 207 may also comprise one or more process phases, in which an extra part of semiconductor material may be provided within the contact openings 219B, which may have the same composition as the material 207B or which may differ from the material 207B in at least one material characteristic. For example, in some illustrative embodiments, the extra part 207C may be provided, at least in an upper portion thereof, so as to provide superior conditions during the subsequent processing, for instance in terms of forming a metal silicide in the extra part 207C. For example, a significantly increased silicon fraction may be provided in the part 207C or a substantially pure silicon material may be deposited. To this end, the process parameters may be appropriately controlled during the deposition process 207 in order to obtain a desired material composition, wherein also a continuous transition in material characteristic or a substantially step wise transition may be established, depending on the device requirements. For example, if desired, a moderately high germanium concentration may be provided for the material 207B, possibly in combination with a moderately high dopant concentration in order to provide high conductivity in combination with a highly strained state, which may thus efficiently act on a channel region 252. Thereafter, the germanium concentration may be reduced or the supply of any respective precursor gases may be discontinued, thereby forming the part 207C with a significantly reduced fraction of germanium, while nevertheless a high dopant concentration may be provided so as to achieve a high conductivity of the part 207C, which may act as a contact element, possibly in combination with an additional metal silicide still to be formed. Furthermore, during the selective deposition process 207, a height level of the part 207C within the contact openings 219B may be adjusted so as to determine a final height of the gate electrode structures 220B after completing the replacement gate approach, as will be discussed later on in more detail.

Thereafter, the processing may be continued by forming an appropriate contact mask so as to cover the transistors 250B while exposing other transistors, such as n-channel transistors.

FIG. 2g schematically illustrates the device 200, wherein an active region 205A comprises a plurality of transistors 250A and corresponding gate electrode structures 220A, which may have the same configuration as the gate electrode structures 220B as previously described with reference to FIGS. 2a-2f. Moreover, as illustrated, contact openings 219A may be provided in the interlayer dielectric material 212 and may connect to cavities 214A, which may have any appropriate size and shape in order to comply with the requirements of the transistors 250A, as is also previously discussed above. The cavities 214A may have a certain degree of under-etching, for instance obtained on the basis of a crystallographically anisotropic etch technique, as is also explained before. Furthermore, the cavities 214A and at least a portion of the contact openings 219A may be filled with a semiconductor material, wherein a portion 210A may represent a strain-inducing semiconductor alloy, such as a silicon/carbon alloy, if a tensile strain component is considered appropriate in a channel region 252 of the transistors 250A. Consequently, the semiconductor material 210A and material 210C may be provided with an appropriate high dopant concentration so as to provide superior conductivity. At the same time, the material composition may be appropriately selected so as to obtained the desired high strain component in the channel region 252, while at the same time the desired silicidation characteristics may be obtained for the portion 210C.

The semiconductor device 200 may be formed on the basis of the same process strategy, as previously discussed, wherein, however, process parameters may be adapted so as to obtain the desired size and shape of the cavities 214A and obtain the materials 210A, 210C for the transistor 250A having the desired characteristics. Thereafter, any hard mask materials, if provided for other transistors, may be removed and the further processing may be continued commonly for any type of transistors.

FIG. 2h schematically illustrates the device 200, wherein, for convenience, the transistors 250A are illustrated only. As shown, a metal silicide 231S may be formed in the semiconductor material 210C and may represent, in combination with the material portion, a contact element 231. The metal silicide 231S may be formed by depositing any appropriate refractory metal, such as nickel, platinum and the like, and initiating a chemical reaction with the underlying silicon material of the portion 210C by performing a heat treatment. Consequently, during the silicidation process, a certain amount of silicon may be consumed in the portion 210C, thereby forming the highly conductive metal silicide material 231S, wherein the degree of change in volume in the material portion 210C due to the chemical reaction may be known in advance so that the final height level of the contact elements 231, i.e., of the top surface 231D of the metal silicide 231S, may be provided with a high degree of controllability based on the initial height of the semiconductor portion 210C and the selection of the process parameters of the silicidation process. As previously discussed, since the transistors 250A and the transistors 250B (see FIG. 2f) may receive the corresponding semiconductor material in individual process sequences, also corresponding height levels of the top surfaces 231D may be adjusted individually, wherein, nevertheless, a high degree of uniformity of the resulting process sequence may be achieved, for instance during the silicidation, since very similar process conditions with respect to silicon concentration and the like may be achieved by controlling the associated selective epitaxial growth processes, as previously discussed. Furthermore the metal silicide 231S may provide an appropriate stop material during the further processing, for instance during subsequent etch processes, CMP processes and the like, thereby providing superior process efficiency and less critical process conditions.

Figure 2I:
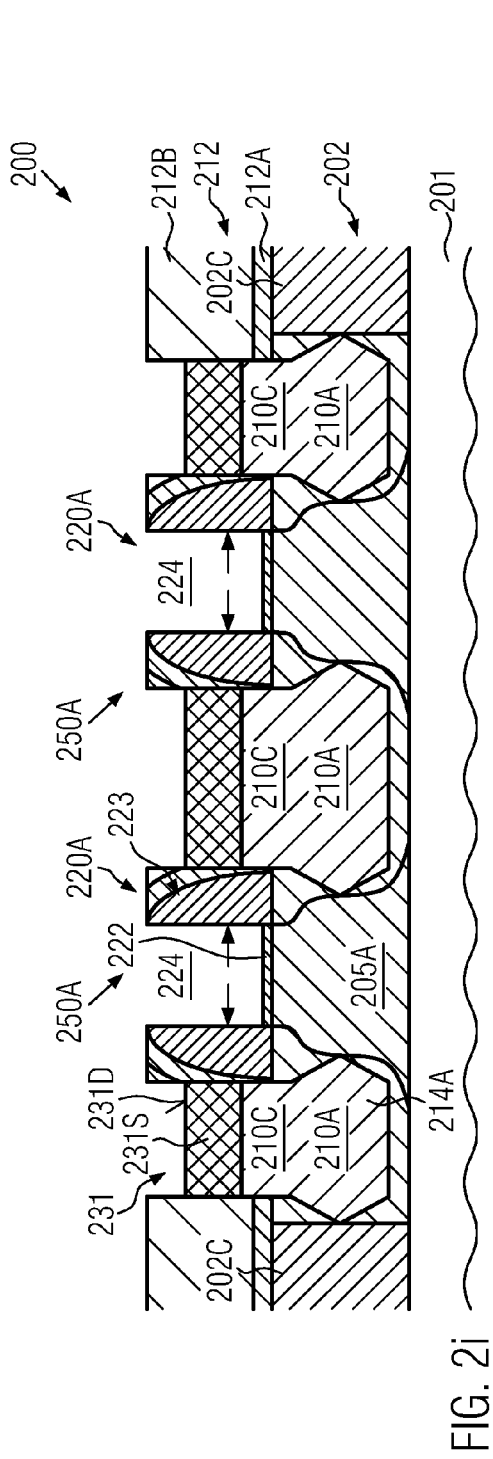

FIG. 2i schematically illustrates the semiconductor device 200 in a further advanced manufacturing stage, wherein, for convenience, the transistors 250A are illustrated, while it should be appreciated that the electrode structures of other transistors may be in a similar configuration as the gate electrode structures 220A. As illustrated, corresponding gate openings 224 may be provided in the gate electrode structure 220A, wherein the lateral dimensions thereof may be substantially determined by the spacer structure 223. The gate openings 224 may be formed, starting from the configuration as shown in FIG. 2h, by applying an etch chemistry for selectively removing silicon nitride material, thereby removing material of the dielectric layer 212A and the cap layer 228 (FIG. 2h), while the metal silicide 231S may act as an efficient etch stop material. For this purpose, hot phosphoric acid and the like may be applied. After exposing the placeholder material 221 (FIG. 2h), a further selective etch process may be applied so as to remove this material, for instance by using TMAH and the like, as is also previously discussed with reference to the semiconductor device 100. During this etch process, the material 222 may act as an efficient etch stop material. Based on the gate openings 224, the further processing may be continued by applying a desired type of replacement gate approach, wherein the dielectric material 221 may be removed, or at least partially may be preserved, depending on the transistor characteristics. For example the dielectric material 222 may already comprise a high-k dielectric material which may have been provided in an early manufacturing stage. In other cases, a gate dielectric material including a high-k dielectric material may be deposited on the basis of well-established process techniques, followed by the deposition of any appropriate electrode material, such as titanium nitride, tantalum nitride and the like, which may also comprise a work function adjusting species that may be appropriate for one type of transistors. Thereafter, this material may be removed from other transistors, in which the presence of the material may be considered inappropriate, by using an appropriate masking regime and an etch process, followed by the deposition of another metal-containing electrode material, possibly in combination with a work function adjusting species. Finally, a desired highly conductive electrode metal may be deposited and any excess material may be removed, for instance by CMP and the like.

Figure 2J:
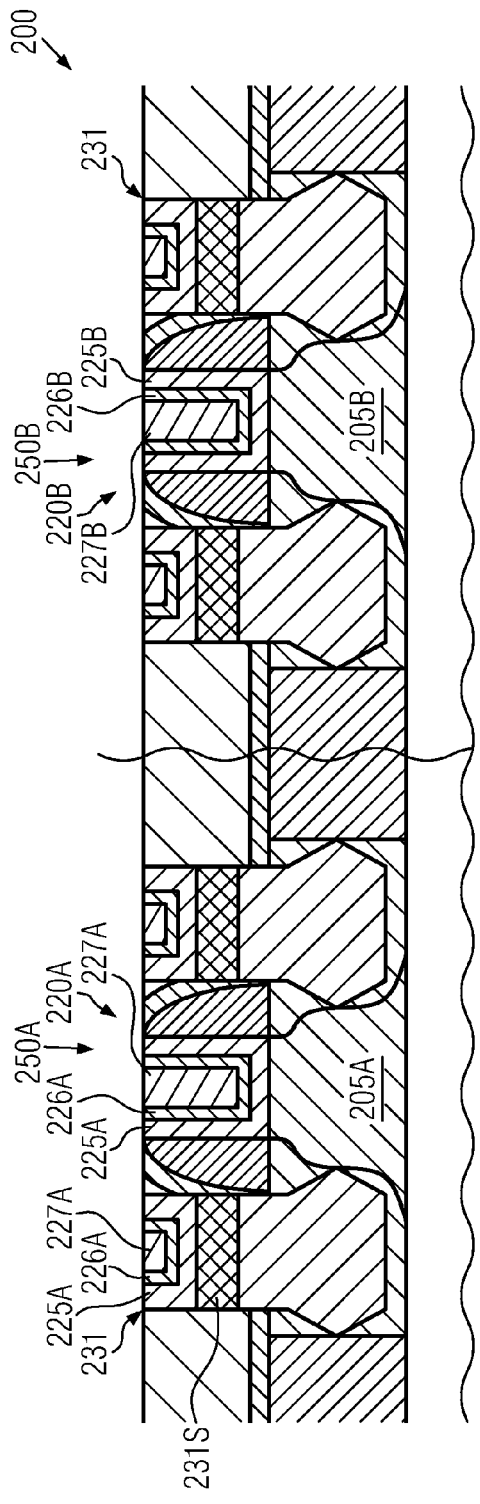

FIG. 2j schematically illustrates the semiconductor device 200 after the above described process sequence. As illustrated, a transistor 250A may comprise the gate electrode structure 220A in the form of a sophisticated high-k metal gate electrode structure. It should be appreciated that, for convenience, a single transistor 250A is illustrated to be provided in the active region 205A, wherein it should be appreciated that two or more of the transistors 250A may be provided in a single active region, as is also previously described. The gate electrode structure 220A may comprise a high-k dielectric material 225A, a first metal-containing electrode material 226A and a second metal-containing electrode material 227A, wherein it should be appreciated that any other appropriate material system may be applied during the preceding replacement gate processing. Similarly, these materials may also be formed above the contact element 231, i.e., above metal silicide material 231S, depending on the degree of recessing of the contact elements 231, which may in turn depend on the finally desired height level of the gate electrode structure 220A, which may be defined by the metal silicide material 231S, as will be explained later on in more detail.

Similarly, the device 200 may comprise the transistors 250B, wherein, for convenience, a single transistor 250B is illustrated to be provided on the basis of the active region 205B. Also in this case, it should be appreciated that two or more of the transistors 250B may be formed in and above the active region 205B, as is discussed above. The gate electrode structure 220B may comprise a gate dielectric material 225B comprising a high-k dielectric material, followed by a metal-containing electrode material 226B and a further metal-containing electrode material 227B, wherein it should be appreciated that the material system of the gate electrode structure 220B may have any appropriate configuration so as to comply with the previous processing and the requirements of the transistor 250B. As discussed before, this material system may also be provided in a more or less pronounced manner above the contact elements 231. It should be appreciated that the materials 225A, 225B may have substantially the same material composition, except for any work function metals and the like, and also the electrode materials 227A, 227B may have the same material composition. On the other hand, the layer or layers 226A, 226B may differ in order to obtain different work functions and thus threshold voltages, as required.

In some illustrative embodiments, the further processing may be continued by using the material systems 225A, 226A, 227A and 225B, 226B, 227B, respectively formed above the contact elements 231, as a part of these contact elements, as long as a reliable electrical isolation of the contact elements 231 and the corresponding gate electrode structures 220A, 220B is guaranteed. In other cases, material may be removed so as to reduce the height of the gate electrode structures 220A, 220B, thereby significantly reducing the probability of creating any leakage current paths.

FIG. 2k schematically illustrates the semiconductor device 200 in an advanced manufacturing stage, in which the height of the gate electrode structures 220A, 220B may be reduced by performing any appropriate material removal process, such as a CMP process, thereby also removing the conductive materials from above the contact elements 231. During the corresponding removal process, the metal silicide material 231S may act as an efficient stop material so that a top surface 220S of the adjacent gate electrode structure 220A, 220B, respectively, may be approximately at the same height level as the top surface 231D of the metal silicide material 231S. In this respect, the term "approximately" is to be understood that a height difference of the surfaces 220S and 231D is 10 nm or less. Consequently, by using the metal silicide material 231S as a stop material, any metal residues may be efficiently removed from the interlayer dielectric material 212, however, without contributing to undue topography non-uniformities. Moreover, well-defined electronic characteristics in terms of conductivity of the gate electrode structures 220A, 220B may be achieved, while at the same time the fringing capacitance may be reduced in a well controllable manner, since the final height of the gate electrode structures is determined by previous well controllable processes, such as a selective epitaxial growth process and a silicidation process.

It should be appreciated that the stop capabilities of the silicide material 231S may further be increased, for instance, by providing a certain degree of platinum upon forming the metal silicide 231S.

Consequently, the transistors 250A, 250B may be provided with an individually adjusted strain-inducing semiconductor material, which may be provided in a late manufacturing stage and which may thus allow forming the initial gate electrode structures 220A, 220B with a high degree of process uniformity. Furthermore, by providing the metal silicide material 231S prior to actually applying the replacement gate approach, superior process conditions, for instance for exposing the place\holder material and adjusting the desired final gate height, may also be achieved.

As a result, the present disclosure provides semiconductor devices and manufacturing techniques in which extremely complex processes, such as a replacement gate approach and the incorporation of an embedded strain-inducing semiconductor material in active regions of transistors, may be "combined" in order to provide superior process efficiency and/or device performance. In the various embodiments disclosed, the incorporation of a strain-inducing material may be achieved independently from the provision of the initial gate electrode structure, thereby providing superior process uniformity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a semiconductor region comprising an embedded strain-inducing semiconductor alloy formed at least partially in drain and source regions;
   a gate electrode structure formed on a portion of said semiconductor region, said gate electrode structure comprising a metal-containing electrode material and a high-k dielectric material; and
   contact areas formed above said strain-inducing semiconductor alloy and comprising a metal silicide having a top surface at a height that substantially corresponds to a height of a top surface of said metal-containing electrode material.

2. The semiconductor device of claim 1, further comprising:
   a second semiconductor region comprising an embedded second strain-inducing semiconductor alloy formed at least partially in second drain and source regions; and
   a second gate electrode structure formed on a portion of said second semiconductor region and comprising a second metal-containing electrode material and a second high-k dielectric material, wherein said embedded second strain-inducing semiconductor alloy differs from said embedded strain-inducing semiconductor alloy.

3. A semiconductor device comprising:
   a semiconductor region of a first transistor comprising a strain-inducing semiconductor alloy and a strained semiconductor material laterally enclosed by said strain-inducing semiconductor alloy, said strained semiconductor material and said strain-inducing semiconductor alloy differing in material composition; and
   a gate electrode structure formed on a portion of said semiconductor region, said gate electrode structure comprising a metal-containing electrode material, a high-k dielectric material and a spacer structure that is aligned to said strained semiconductor material.

4. The semiconductor device of claim 3, further comprising:
   a second semiconductor region of a second transistor comprising a second strain-inducing semiconductor alloy and a second strained semiconductor material laterally enclosed by said second strain-inducing semiconductor alloy, wherein said second semiconductor material and said second strain-inducing semiconductor material differ in material composition; and
   a second gate electrode structure formed on a portion of said second semiconductor region, wherein said second gate electrode structure comprises a second metal-containing electrode material, a second high-k dielectric material and a second spacer structure that is aligned to said second strained semiconductor material.

5. The semiconductor device of claim 3, wherein said strain-inducing semiconductor alloy is positioned at least partially in drain and source regions of said first transistor and said strained semiconductor material is positioned at least partially in a channel region of said first transistor.

6. The semiconductor device of claim 3, wherein a bottom of said strained semiconductor material extends to a depth level in said semiconductor region that is below a depth level of a bottom of said strain-inducing semiconductor alloy.

7. The semiconductor device of claim 3, wherein said semiconductor region comprises a semiconductor material layer that is positioned below said strain-inducing semiconductor alloy.

8. The semiconductor device of claim 7, wherein said semiconductor material layer is positioned above a buried insulating material.

9. The semiconductor device of claim 4, wherein said second strain-inducing semiconductor alloy is positioned at least partially in drain and source regions of said second transistor and said second strained semiconductor material is positioned at least partially in a channel region of said second transistor.

10. The semiconductor device of claim 4, wherein a bottom of said second strained semiconductor material extends to a depth level in said second semiconductor region that is below a depth level of a bottom of said second strain-inducing semiconductor alloy.

11. The semiconductor device of claim 4, wherein said strain-inducing semiconductor alloy comprises silicon and carbon and said second strain-inducing semiconductor alloy comprises silicon and germanium.

12. The semiconductor device of claim 4, wherein said first transistor is an N-channel transistor and said second transistor is a P-channel transistor.

13. A semiconductor device comprising:
an isolation structure laterally isolating an active region of said semiconductor device;
a plurality of transistor elements positioned in and above said active region, each of said plurality of transistor elements comprising a gate electrode structure that comprises a high-k gate dielectric material and a metal-containing electrode material; and
a plurality of material regions, each comprising:
a lower strain-inducing portion that is embedded in one of a source region and a drain region of a respective one of said plurality of transistor elements, said lower strain-inducing portion comprising a first semiconductor material; and
an upper contact portion that extends above said active region, said upper contact portion comprising a second semiconductor material and a metal silicide, wherein a height level of a top surface of said upper contact portion substantially corresponds to a height level of a top surface of said metal-containing electrode material.

14. The semiconductor device of claim 13, wherein each of said plurality of transistor elements has a same conductivity type.

15. The semiconductor device of claim 13, wherein a composition of said first semiconductor material is substantially the same as a composition of said second semiconductor material.

16. The semiconductor device of claim 13, wherein said first and semiconductor materials comprise silicon and germanium.

17. The semiconductor device of claim 16, wherein a germanium content of said first semiconductor material is greater than a germanium content of said second semiconductor material in at least part of said upper contact portion.

18. The semiconductor device of claim 13, wherein said metal silicide is positioned at said top surface of said upper contact portion.

19. The semiconductor device of claim 13, wherein said upper contact portion further comprises said high-k dielectric material and said metal containing electrode material.

20. The semiconductor device of claim 19, wherein said metal-containing electrode material of said upper contact portion is positioned at said top surface of said upper contact portion.

* * * * *